(12) United States Patent
Hatate

(10) Patent No.: US 7,449,760 B2
(45) Date of Patent: Nov. 11, 2008

(54) MAGNETORESISTIVE ELEMENT, MAGNETIC MEMORY CELL, AND MAGNETIC MEMORY DEVICE

(75) Inventor: Hitoshi Hatate, Chuo-ku (JP)

(73) Assignee: TDK Corporation, Tokyo (JP)

( * ) Notice: Subject to any disclaimer, the term of this patent is extended or adjusted under 35 U.S.C. 154(b) by 863 days.

(21) Appl. No.: 10/934,565

(22) Filed: Sep. 7, 2004

(65) Prior Publication Data

US 2005/0052899 A1 Mar. 10, 2005

(30) Foreign Application Priority Data

Sep. 5, 2003 (JP) ............................. 2003-314639

(51) Int. Cl.
*H01L 29/82* (2006.01)
*H01L 43/00* (2006.01)
(52) U.S. Cl. ..................... 257/421; 257/422
(58) Field of Classification Search .......... 257/421–426
See application file for complete search history.

(56) References Cited

U.S. PATENT DOCUMENTS

| 5,343,422 | A |   | 8/1994 | Kung et al. |   |
|---|---|---|---|---|---|
| 5,629,922 | A |   | 5/1997 | Moodera et al. |   |
| 7,016,221 | B2 | * | 3/2006 | Ezaki et al. | ................. 365/158 |
| 7,026,677 | B2 | * | 4/2006 | Kamijima et al. | ........... 257/421 |
| 2003/0111626 | A1 |   | 6/2003 | Hosotani |   |
| 2005/0018476 | A1 | * | 1/2005 | Kamijima et al. | ........... 365/158 |
| 2007/0019462 | A1 | * | 1/2007 | Ezaki et al. | ................. 365/158 |

FOREIGN PATENT DOCUMENTS

| EP | 0 875 901 A2 | 11/1998 |
| JP | A 9-91949 | 4/1997 |
| JP | 2001273759 | 10/2001 |
| JP | A 2001-273759 | 10/2001 |

* cited by examiner

*Primary Examiner*—Cuong Q Nguyen
(74) *Attorney, Agent, or Firm*—Oliff & Berridge, PLC

(57) ABSTRACT

The present invention provides a magnetic memory device capable of performing stable information writing operation by efficiently using a magnetic field generated by current flowing in a conductor and stably holding written information. A magnetic memory device includes: magnetic yoke disposed in correspondence with a region in which a write bit line and a write word line cross each other and constructed so as to surround partially or entirely the periphery of the lines; and a stacked body including a second magnetic layer of which magnetization direction changes according to an external magnetic field, and magnetically coupled to the magnetic yoke. The second magnetic layer has coercive force larger than that of the magnetic yoke, and coercive force of the magnetic yoke increases toward the second magnetic layer. Thus, the influence by remanent magnetization of the magnetic yoke can be suppressed, and the magnetization direction of the second magnetic layer can be stably held.

13 Claims, 27 Drawing Sheets

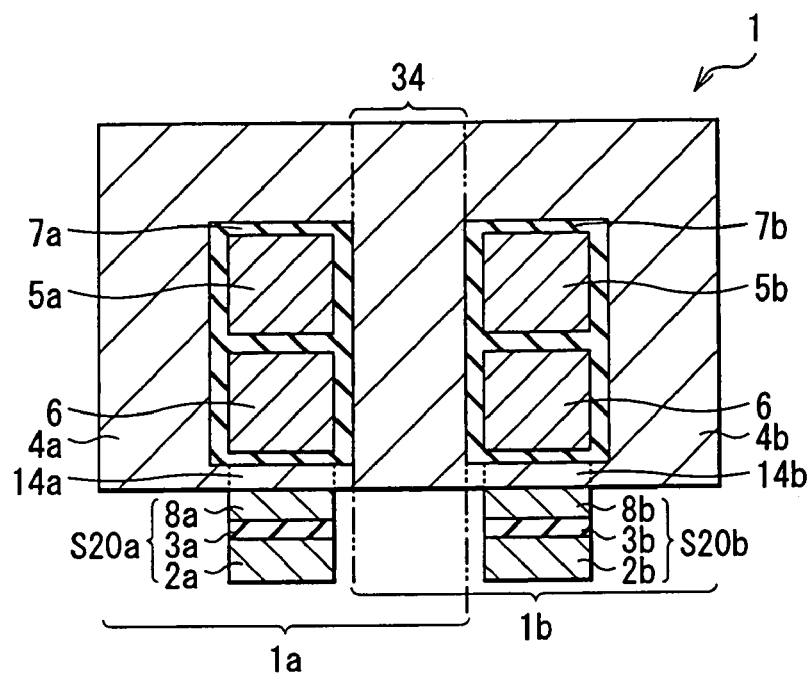
FIG. 5A
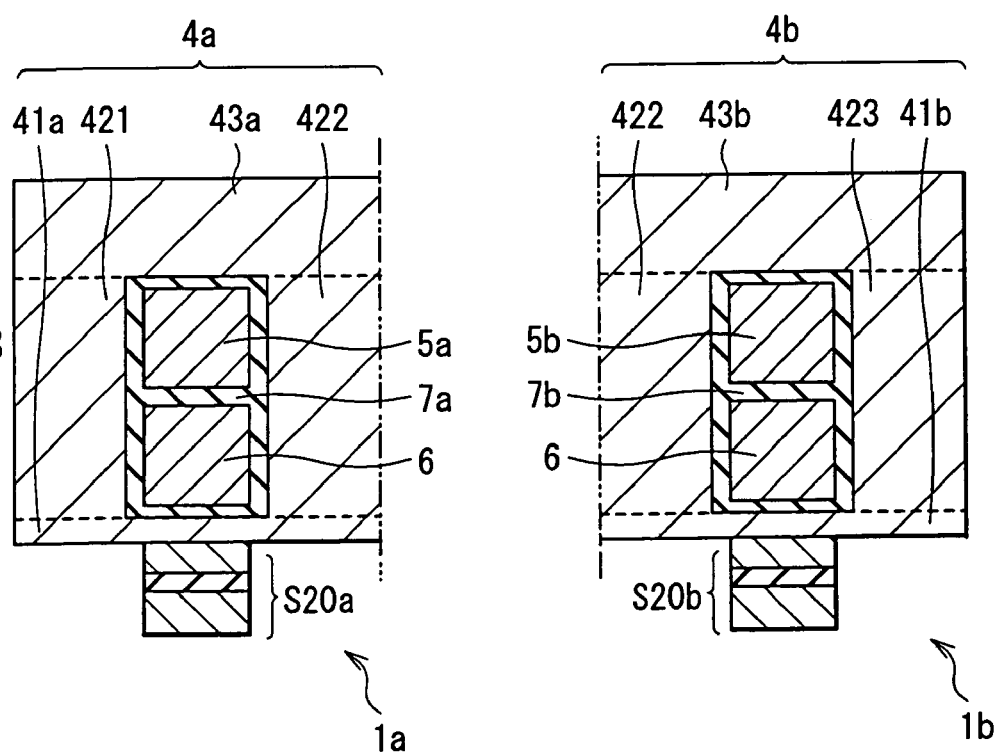
FIG. 5B
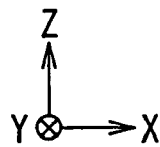

「0」

「1」

MAGNETORESISTIVE ELEMENT, MAGNETIC MEMORY CELL, AND MAGNETIC MEMORY DEVICE

BACKGROUND OF THE INVENTION

1. Field of the Invention

The present invention relates to a magnetoresistive element and a magnetic memory cell each including a magneto-sensitive layer of which magnetization direction changes according to an external magnetic field, and to a magnetic memory device for recording/reading information by using a change in the magnetization direction of the magneto-sensitive layer in the magnetoresistive element and the magnetic memory cell.

2. Description of the Related Art

Conventionally, as general memories used for an information processor such as a computer or a communication device, volatile memories such as a DRAM (Dynamic Random Access Memory) and an SRAM (Static RAM) are used. The volatile memories have to be refreshed by always supplying current to hold stored information. When the power source is turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing which means that information processing can be performed everywhere at any time is rapidly being progressed. Development of a nonvolatile memory adapted for higher-speed processing as a key device of such information device development is in strong demand.

As a technique effective to increase the speed of the nonvolatile memory, a magnetic random access memory (hereinbelow, described as MRAM) is known in which magnetic memory elements each for storing information in accordance with the magnetization direction along the axis of easy magnetization of a ferromagnetic layer are arranged in a matrix. The MRAM stores information by using a combination of the magnetization directions in two ferromagnetic members. On the other hand, stored information is read by detecting a resistance change (that is, a change in current or voltage) which occurs between the case where the magnetization direction is parallel with a reference direction and the case where the magnetization direction is not parallel with the reference direction. Since the MRAM operates with the principle, it is important that the resistance change ratio is as high as possible to perform stable writing and reading in the MRAM.

The MRAM currently used in practice utilizes the giant magneto-resistive (GMR) effect. The GMR effect is a phenomenon such that when two magnetic layers are disposed so that their axes of easy magnetization are parallel with each other, in the case where the magnetization directions of the layers are in parallel along the axis of easy magnetization, the resistance value becomes the minimum. In the case where the magnetization directions are not parallel with each other, the resistance value becomes the maximum. An MRAM using a GMR element capable of obtaining such a GMR effect (hereinbelow, described as GMR-MRAM) is disclosed in, for example, U.S. Pat. No. 5,343,422.

Recently, aiming at further improvement in storing speed, access speed, and the like, an MRAM having a TMR element using tunneling magneto-resistive effect (TMR) is proposed in place of the GMR-MRAM. The TMR effect is an effect such that the tunnel current passing through an insulating layer changes in accordance with relative angles of the magnetization directions in two ferromagnetic layers sandwiching a very-thin insulating layer (tunnel barrier layer). When the magnetization directions in the two ferromagnetic layers are parallel with each other, the resistance value becomes the minimum. On the contrary, when the magnetization directions are not parallel with each other, the resistance value becomes the maximum. In the TMR-MRAM, when the TMR element has a configuration of, for example, "CoFe/aluminum oxide/CoFe", the resistance change ratio is high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a current magnetic field is generated by passing current to a conductor as a write line disposed near the TMR element. By using the current magnetic field, the magnetization direction of the magnetic layer in the TMR element is changed to a predetermined direction, thereby storing information. As a method of reading stored information, a method of passing current in the direction perpendicular to a tunnel barrier layer and detecting a resistance change in the TMR element is known. Such TMR-MRAM techniques are disclosed in U.S. Pat. No. 5,629,922 and Japanese Patent Laid-open No. Hei 9-91949.

Recently, higher packing density of a magnetic memory device is in increasing demand and, accordingly, reduction in the size of the TMR element is also required. As the TMR element is becoming finer, due to the influence of a demagnetizing field generated by magnetic poles at both ends of the TMR element, the magnetization direction in a magnetic layer (free magnetization direction layer) for storing information becomes unstable and it becomes difficult to hold recorded information. To solve the problem, a structure in which a closed magnetic circuit is formed in addition to the free magnetization direction layer around a conductor (write line) near the TMR element is proposed (refer to, for example, Japanese Patent Laid-open No. 2001-273759). Since the closed magnetic circuit is constructed by a free magnetization direction layer related to recording, the adverse influence exerted by the demagnetizing field can be avoided and a magnetic memory device of high packing density can be realized. Further, in this case, both of two write lines extend in the closed magnetic circuit, so that magnetization can be efficiently inverted.

However, in the magnetic memory device having the structure as disclosed in Japanese Patent Laid-open No. 2001-273759, remanent magnetization generated in a magnetic body (closed magnetic circuit layer) as a component of a closed magnetic circuit after writing operation acts on a free magnetization direction layer, thereby disturbing the magnetization direction of the free magnetization direction layer. Consequently, there is the possibility that information to be recorded is not held and an error occurs at the time of reading.

SUMMARY OF THE INVENTION

The present invention has been achieved in consideration of such problems and its first object is to provide a magneto-resistive element, a magnetic memory cell, and a magnetic memory device including the magneto-resistive element and the magnetic memory cell having them, to which information can be stably written by efficiently using a magnetic field generated by current flowing in a conductor and which can stably hold written information.

A magneto-resistive element according to a first aspect of the invention has: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, and magnetically coupled to the magnetic yoke. The magneto-sensitive layer has coercive force larger than that of the magnetic yoke, and the coercive force of the magnetic yoke increases toward the magneto-sensitive layer.

A magnetic memory cell according to the first aspect of the invention comprises a pair of magneto-resistive elements each having: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, and magnetically coupled to the magnetic yoke. The pair of magneto-resistive elements shares a part of the magnetic yoke, the magneto-sensitive layer has coercive force larger than that of the magnetic yoke, and the coercive force of the magnetic yoke increases toward the magneto-sensitive layer.

A magnetic memory device according to the first aspect of the invention comprises: a first write line; a second write line extending so as to cross the first write line; and a memory cell including a pair of magneto-resistive elements. Each of the pair of magneto-resistive elements includes: a magnetic yoke disposed in correspondence with a region in which the first and second write lines cross each other and constructed so as to surround partially or entirely the periphery of the first and second write lines; and a stacked body including a magneto-sensitive layer of which magnetization direction changes according to an external magnetic field and which is magnetically coupled to the magnetic yoke. The pair of magneto-resistive elements shares a part of the magnetic yoke. The magneto-sensitive layer has coercive force larger than that of the magnetic yoke, and the magnetic yoke has coercive force which increases toward the magneto-sensitive layer.

In the magneto-resistive element, magnetic memory cell, and magnetic memory device according to the first aspect of the invention, the magneto-sensitive layer has coercive force larger than that of the magnetic yoke, and the coercive force of the magnetic yoke increases toward the magneto-sensitive layer. Thus, the influence of remanent magnetization of the magnetic yoke is suppressed and the magnetization direction of the magneto-sensitive layer is stably held.

A magneto-resistive element according to a second aspect of the invention includes: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, and magnetically coupled to the magnetic yoke. A connection part with the stacked body in the magnetic yoke also serves as the magneto-sensitive layer, and coercive force of the magnetic yoke increases toward the magneto-sensitive layer and is the maximum in the magneto-sensitive layer.

A magnetic memory cell according to the second aspect of the invention has a pair of magneto-resistive elements each comprising: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, and magnetically coupled to the magnetic yoke. The pair of magneto-resistive elements shares a part of the magnetic yoke, a connection part with the stacked body in the magnetic yoke also serves as the magneto-sensitive layer, and coercive force of the magnetic yoke increases toward the magneto-sensitive layer and is the maximum in the magneto-sensitive layer.

A magnetic memory device according to the second aspect of the invention includes: a first write line; a second write line extending so as to cross the first write line; and a memory cell including a pair of magneto-resistive elements. Each of the pair of magneto-resistive elements includes: a magnetic yoke disposed in correspondence with a region in which the first and second write lines cross each other and constructed so as to surround partially or entirely the periphery of the first and second write lines; and a stacked body including a magneto-sensitive layer of which magnetization direction changes according to an external magnetic field and which is magnetically coupled to the magnetic yoke, and the pair of magneto-resistive elements share a part of the magnetic yoke. A part connected to the stacked body, of the magnetic yoke also serves as the magneto-sensitive layer, and the coercive force of the magnetic yoke increases toward the magneto-sensitive layer and is the maximum in the magneto-sensitive layer.

In the magneto-resistive element, magnetic memory cell, and magnetic memory device according to the second aspect of the invention, the magnetic yoke has coercive force which increases toward the magneto-sensitive layer and is the maximum in the magneto-sensitive layer. Thus, the influence of remanent magnetization of the part except for the connection part in the magnetic yoke is suppressed and the magnetization direction of the magneto-sensitive layer is stably held.

In the magneto-resistive element, magnetic memory cell, and magnetic memory device according to the first or second aspect of the invention, the magnetic yoke may includes: a pair of pillar yokes extending in a direction orthogonal to a layer stacked face of the stacked body while facing each other over the conductor (first and second write lines); and a beam yoke which is disposed on the side of one of faces of the stacked body and to which one end of each of the pair of pillar yokes is connected. In this case, desirably, the beam yoke has coercive force larger than that of the pair of pillar yokes.

In the magneto-resistive element, magnetic memory cell, and magnetic memory device according to the first or second aspect of the invention, the magnetic yoke may include: a pair of pillar yokes extending in a direction orthogonal to a layer stacked face of the stacked body while facing each other over the conductor (first and second write lines); a first beam yoke to which one end on the stacked body side, of each of the pair of pillar yokes is connected; and a second beam yoke to which the other end of each of the pair of pillar yokes is connected. In this case, desirably, the pair of pillar yokes has coercive force larger than that of the second beam yoke, and the first beam yoke has coercive force larger than that of the pair of pillar yokes.

A magneto-resistive element according to a third aspect of the invention comprises: a magnetic yoke disposed in correspondence with a partial region along an extension direction of a conductor and constructed so as to surround a part of the periphery of the conductor; and a stacked body including a magneto-sensitive layer of which magnetization direction changes according to an external magnetic field, and magnetically coupled to the magnetic yoke, and the magneto-sensitive layer has coercive force larger than that of the magnetic yoke. The "external magnetic field" in the invention means a magnetic field generated by current flowing in the conductor or a return magnetic field generated in the magnetic yoke.

A magnetic memory cell according to the third aspect of the invention has a pair of magneto-resistive elements each including: a magnetic yoke disposed in correspondence with a partial region along an extension direction of a conductor and constructed so as to surround a part of the periphery of the conductor; and a stacked body including a magneto-sensitive layer of which magnetization direction changes according to an external magnetic field, and magnetically coupled to the magnetic yoke. The pair of magneto-resistive elements shares a part of the magnetic yoke, and the magneto-sensitive layer has coercive force larger than that of the magnetic yoke. "Share" in the invention means that a pair of magnetic yokes is electrically and magnetically continued.

A magnetic memory device according to the third aspect of the invention comprises: a first write line; a second write line extending so as to cross the first write line; and a magnetic memory cell including a pair of magneto-resistive elements. Each of the pair of magneto-resistive elements includes: a magnetic yoke disposed in correspondence with a region in which the first and second write lines cross each other and constructed so as to surround a part of the periphery of the first and second write lines; and a stacked body including a magneto-sensitive layer of which magnetization direction changes according to an external magnetic field and which is magnetically coupled to the magnetic yoke. The pair of magneto-resistive elements shares a part of the magnetic yoke, and the magneto-sensitive layer has coercive force larger than that of the magnetic yoke.

In the magneto-resistive element, magnetic memory cell, and magnetic memory device according to the third aspect of the invention, the magneto-sensitive layer has coercive force larger than that of the magnetic yoke. Thus, the influence of remanent magnetization of the magnetic yoke is suppressed and the magnetization direction of the magneto-sensitive layer is stably held.

A magneto-resistive element according to a fourth aspect of the invention comprises: a magnetic yoke disposed in correspondence with a partial region along an extension direction of a conductor and constructed so as to surround a part of the periphery of the conductor; and a stacked body including a magneto-sensitive layer of which magnetization direction changes according to an external magnetic field, and magnetically coupled to the magnetic yoke. A connection part with the stacked body in the magnetic yoke also serves as the magneto-sensitive layer, and the magneto-sensitive layer has coercive force larger than that of the part other than the connection part in the magnetic yoke.

A magnetic memory cell according to a fourth aspect of the invention includes a pair of magneto-resistive elements each comprising: a magnetic yoke disposed in correspondence with a partial region along an extension direction of a conductor and constructed so as to surround a part of the periphery of the conductor; and a stacked body including a magneto-sensitive layer of which magnetization direction changes according to an external magnetic field, and magnetically coupled to the magnetic yoke, and the pair of magneto-resistive elements share a part of the magnetic yoke. A connection part with the stacked body in the magnetic yoke also serves as the magneto-sensitive layer, and the magneto-sensitive layer has coercive force larger than that of the part other than the connection part in the magnetic yoke.

A magnetic memory device according to the fourth aspect of the invention comprises: a first write line; a second write line extending so as to cross the first write line; and a magnetic memory cell including a pair of magneto-resistive elements. Each of the pair of magneto-resistive elements includes: a magnetic yoke disposed in correspondence with a region in which the first and second write lines cross each other and constructed so as to surround a part of the periphery of the first and second write lines; and a stacked body including a magneto-sensitive layer of which magnetization direction changes according to an external magnetic field and which is magnetically coupled to the magnetic yoke, and the pair of magneto-resistive elements share a part of the magnetic yoke. The magneto-sensitive layer has coercive force larger than that of the magnetic yoke.

In the magneto-resistive element, magnetic memory cell, and magnetic memory device according to the fourth aspect of the invention, the magneto-sensitive layer has coercive force larger than that of the part other than the connection part in the magnetic yoke. Thus, the influence of remanent magnetization of the part other than the connection part in the magnetic yoke is suppressed and the magnetization direction of the magneto-sensitive layer is stably held.

In the magneto-resistive element, magnetic memory cell, and magnetic memory device according to the first to fourth aspects of the invention, the stacked body may be constructed so that current flows in the direction orthogonal to the layer stacked face or the current flows in the direction along the layer stacked face.

As described hereinbelow, each of the magneto-resistive element, magnetic memory cell, and magnetic memory device according to the first aspect of the invention has the magnetic yoke disposed in correspondence with a partial region (region in which the first and second write lines cross each other) along an extension direction of a conductor and constructed so as to surround partially or entirely the periphery of the conductor (first and second write lines); and a stacked body including a magneto-sensitive layer of which magnetization direction changes according to an external magnetic field, and magnetically coupled to the magnetic yoke. The magneto-sensitive layer has coercive force larger than that of the magnetic yoke, and the coercive force of the magnetic yoke increases toward the magneto-sensitive layer. Thus, the influence of remanent magnetization of the magnetic yoke can be suppressed and the magnetization direction of the magneto-sensitive layer can be stably held. Consequently, a read error caused by unintentional magnetization inversion in the magneto-sensitive layer can be prevented, and reliability of reading operation improves.

Each of the magneto-resistive element, magnetic memory cell, and magnetic memory device according to the second aspect of the invention includes: a magnetic yoke disposed in correspondence with a partial region (region in which the first and second write lines cross each other) along an extension direction of a conductor and constructed so as to surround partially or entirely the periphery of the conductor (first and second write lines); and a stacked body including a magneto-sensitive layer of which magnetization direction changes according to an external magnetic field, and magnetically coupled to the magnetic yoke. A connection part with the stacked body in the magnetic yoke also serves as the magneto-sensitive layer, and coercive force of the magnetic yoke increases toward the magneto-sensitive layer and is the maximum in the magneto-sensitive layer. Thus, the influence of remanent magnetization of the part except for the connection part in the magnetic yoke can be suppressed and the magnetization direction of the magneto-sensitive layer can be stably held. Consequently, a read error caused by unintended magnetization inversion in the magneto-sensitive layer can be prevented, and reliability of reading operation is improved.

Each of the magneto-resistive element, magnetic memory cell, and magnetic memory device according to the third aspect of the invention has: a magnetic yoke disposed in correspondence with a partial region (region in which the first and second write lines cross each other) along an extension direction of a conductor and constructed so as to surround a part of the periphery of the conductor (first and second write lines); and a stacked body including a magneto-sensitive layer of which magnetization direction changes according to an external magnetic field, and magnetically coupled to the magnetic yoke, and the magneto-sensitive layer has coercive force larger than that of the magnetic yoke. Thus, the influence of remanent magnetization of the magnetic yoke can be suppressed and the magnetization direction of the magneto-sensitive layer can be stably held. Consequently, a read error caused by unintended magnetization inversion in the magneto-sensitive layer can be prevented, and reliability of the reading operation is improved.

The magneto-resistive element, magnetic memory cell, and magnetic memory device according to the fourth aspect of the invention comprises: a magnetic yoke disposed in correspondence with a partial region (region in which the first and second write lines cross each other) along an extension direction of a conductor and constructed so as to surround a part of the periphery of the conductor (first and second write lines); and a stacked body including a magneto-sensitive layer of which magnetization direction changes according to an external magnetic field, and magnetically coupled to the magnetic yoke. A connection part with the stacked body in the magnetic yoke also serves as the magneto-sensitive layer, and the magneto-sensitive layer has coercive force larger than that of the part other than the connection part in the magnetic yoke. Thus, the influence of remanent magnetization of the part other than the connection part in the magnetic yoke can be suppressed and the magnetization direction of the magneto-sensitive layer can be stably held. Consequently, a read error caused by unintended magnetization inversion in the magneto-sensitive layer can be prevented, and reliability of a reading operation improves.

Other and further objects, features and advantages of the invention will appear more fully from the following description.

BRIEF DESCRIPTION OF THE DRAWINGS

FIGS. 5A and 5B are cross sections showing the configuration of a plane taken along line V-V of the memory cell illustrated in FIG. 3.

DETAILED DESCRIPTION OF THE PRFERRED EMBODIMENTS

Embodiments of the invention will now be described in detail hereinbelow with reference to the drawings.

First Embodiment

First, with reference to FIGS. 1 to 7, the configuration of a magnetic memory device according to a first embodiment of the invention will be described.

Figure 1:
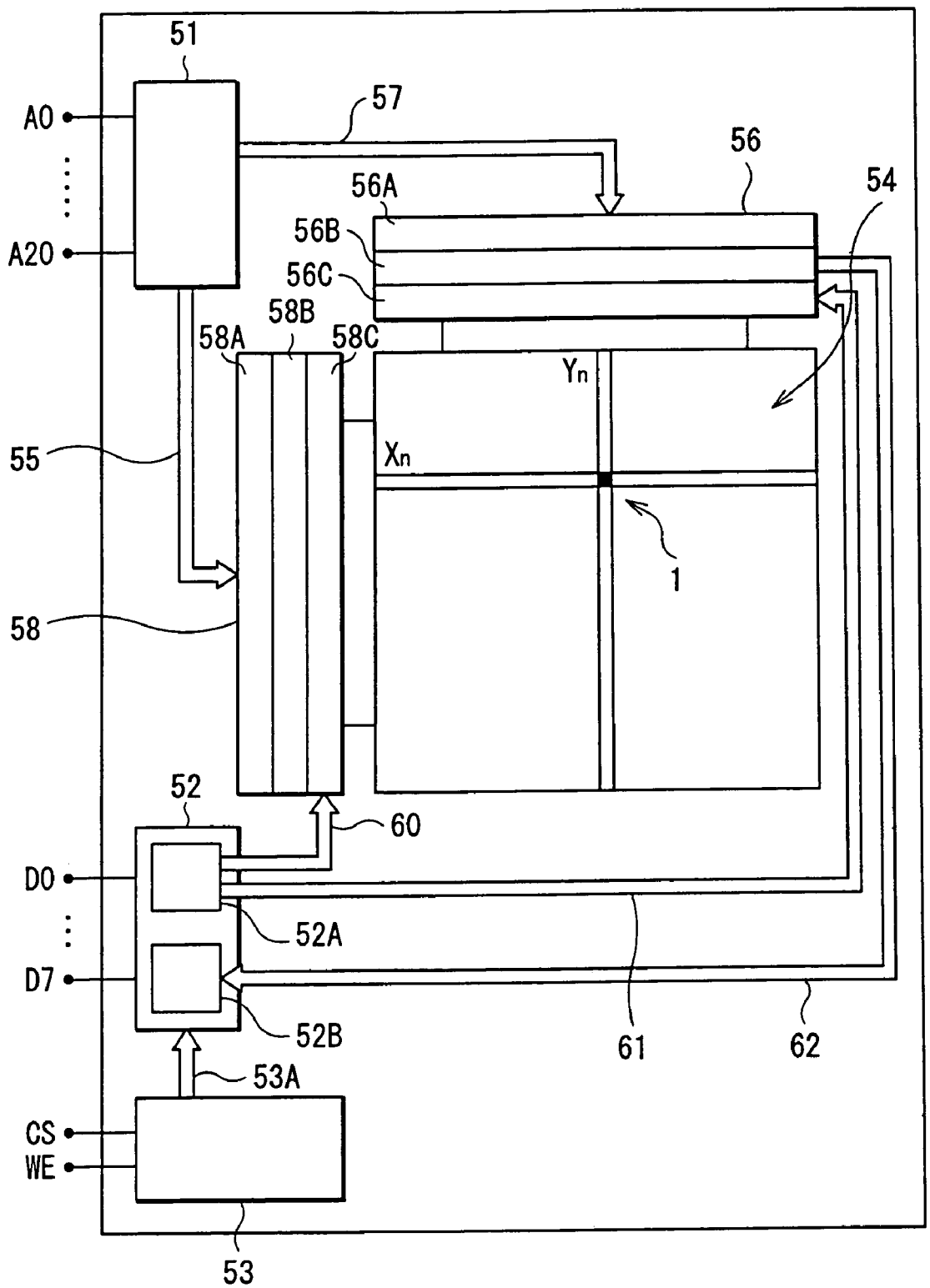
FIG. 1 is a block diagram showing a general configuration of a magnetic memory device according to a first embodiment of the invention.

FIG. 1 is a conceptual diagram showing a general configuration of a magnetic memory device in the embodiment. The magnetic memory device has an address buffer 51, a data buffer 52, a control logic part 53, a memory cell group 54, a first drive control circuit part 56, a second drive control circuit part 58, external address input terminals A0 to A20, and external data terminals D0 to D7.

The memory cell group 54 has a matrix structure in which a number of memory cells 1 each having a pair of tunneling magneto-resistive elements (hereinbelow, called TMR elements) are arranged in a word line direction (X direction) and a bit line direction (Y direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit part 56 has an address decoder circuit 56A, a sense amplification circuit 56B, and a current drive circuit 56C in the Y direction. The second drive control circuit part 58 has an address decoder circuit 58A, a constant current circuit 58B, and a current drive circuit 58C in the X direction.

The address decoder circuits 56A and 58A are to select a word decode line 72 (which will be described later) and a bit decode line 71 (which will be described later) according to an input address signal. The sense amplification circuit 56B and the constant current circuit 58B are circuits driven at the time of performing reading operation. The current drive circuits 56C and 58C are circuits driven at the time of performing writing operation.

The sense amplification circuit 56B and the memory cell group 54 are connected to each other via a plurality of bit decode lines 71 in which the sense current flows at the time of reading operation. Similarly, the constant current circuit 58B and the memory cell group 54 are connected to each other via a plurality of word decode lines 72 in which the sense current flows at the time of reading operation.

The Y-direction current drive circuit 56C and the memory cell group 54 are connected to each other via write bit lines 5 (which will be described later) necessary at the time of writing operation. Similarly, the X-direction current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit part 56 via a Y-direction address line 57 and the X-direction address decoder circuit 58A in the second drive control circuit part 58 via an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58A by a buffer amplifier (not shown) provided in the address buffer 51. Further, the address buffer 51 functions to divide the amplified address signal into two signals and output the signals to the Y-direction address decoder circuit 56A via the Y-direction address line 57 and to the X-direction address decoder circuit 58A via the X-direction address line 55.

The data buffer 52 is constructed by an input buffer 52A and an output buffer 52B, has the external data terminals D0 to D7, is connected to the control logic part 53, and operates by an output control signal 53A from the control logic part 53. The input buffer 52A is connected to the Y-direction current drive circuit 56C in the first drive control circuit part 56 and the X-direction current drive circuit 58C in the second drive control circuit part 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B by an internally provided buffer amplifier (not shown) and to output the resultant signal with low impedance to the external data terminals D0 to D7.

The control logic part 53 has a chip select terminal CS and a write enable terminal WE and is connected to the data buffer 52. The control logic part 53 functions to receive a signal voltage from the chip select terminal CS for selecting a memory cell to be subject to reading/writing from the group 54 of plural memory cells and a signal voltage from the write enable terminal WE for outputting a write permit signal and to output the output control signal 53A to the data buffer 52.

The configuration related to information writing operation in the magnetic memory device of the embodiment will now be described.

Figure 2:
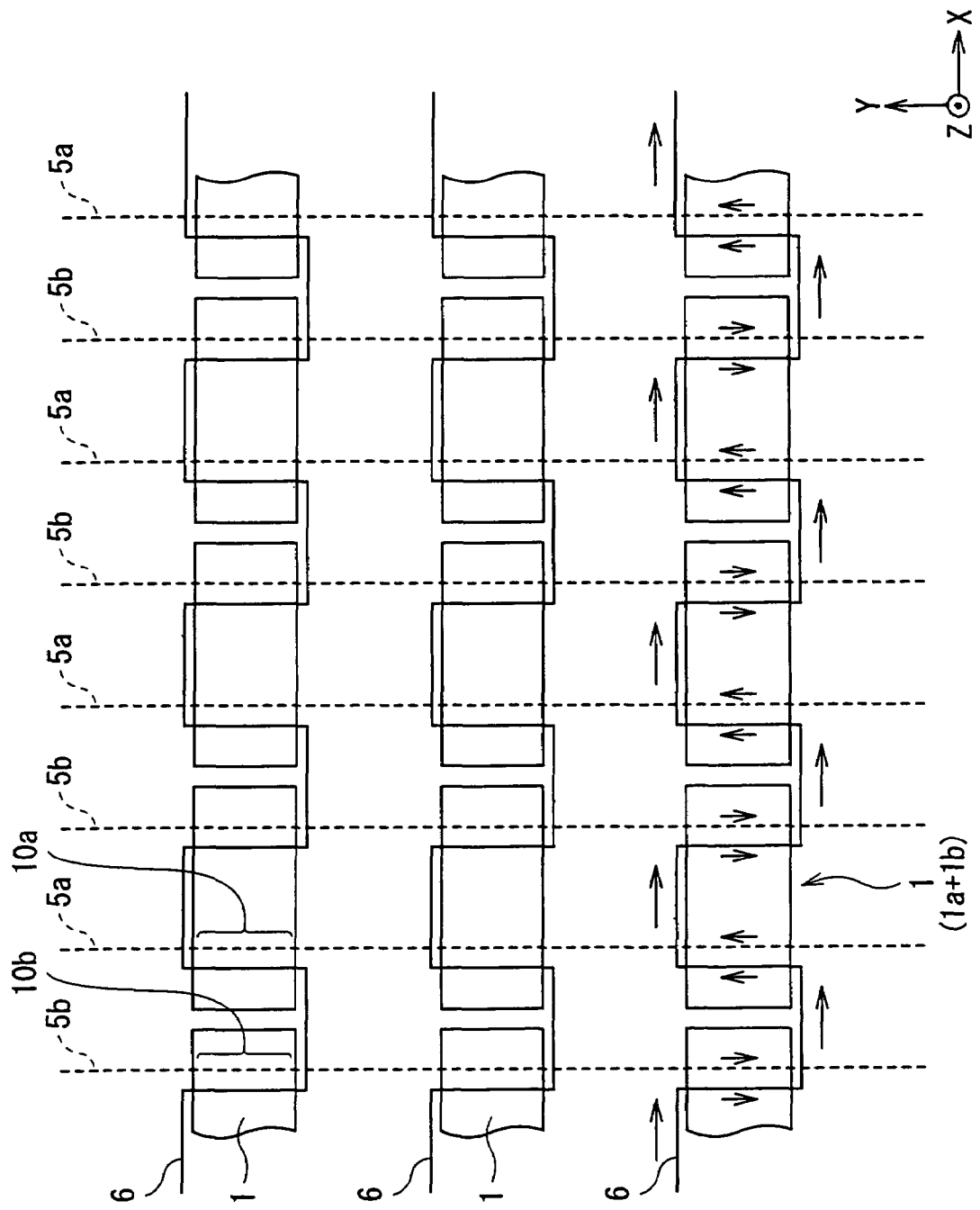
FIG. 2 is a plan view showing the configuration of a write line of the magnetic memory device illustrated in FIG. 1.

FIG. 2 is a conceptual diagram showing a configuration in plan view of a main part related to the writing operation in the memory cell group 54. As shown in FIG. 2, the magnetic memory device of the embodiment includes a plurality of write bit lines 5a and 5b and the plurality of write word lines 6 extending so as to cross the plurality of write bit lines 5a and 5b. Each region where the write bit lines 5a and 5b and the write word line 6 cross each other includes a parallel part 10a in which the write bit line 5a and the write word line 6 extend parallel with each other and a parallel part 10b in which the write bit line 5b and the write word line 6 extend parallel with each other. Concretely, as shown in FIG. 2, the write word lines 6 extend in the X direction in a rectangular wave shape and the write bit lines 5a and 5b extend in the Y direction alternately and linearly. The rising and falling portions of the rectangular wave shape of the write word lines 6 form the plurality of parallel parts 10a and 10b in cooperation with the write bit lines 5a and 5b. The memory cell 1 is provided in the region where the write bit lines 5a and 5b cross the write word line 6 so as to include at least a part of the parallel parts 10a and 10b. The configuration that the memory cell 1 is provided in the crossing region includes a case where the memory cell 1 is provided next to the intersecting point. The memory cell 1 is constructed by TMR elements 1a and 1b, the TMR element 1a is provided in a region where the write bit line 5a and the write word line 6 cross each other, and the other TMR element 1b is provided in the region where the write bit line 5b and the write word line 6 cross each other. The. TMR elements 1a and 1b are a concrete example corresponding to "a pair of magneto-resistive elements" of the invention.

To the write bit lines 5a and 5b and the write word line 6, currents from the Y-direction current drive circuit 56C and the X-direction current drive circuit 58C flow. The current flowing in the write bit line 5a and the current flowing in the write bit line 5b are always in the opposite directions. For example, as shown by the arrows in FIG. 2, when the current direction in the write bit lines 5a is set as +Y direction, the current direction in the write bit lines 5b is -Y direction. Therefore, in this case, when the current directions in the write word lines 6 are set as +X direction as a whole (from left to right in the drawing sheet), the direction of current in the write bit line 5a and that in the write word line 6 in the TMR element 1a are parallel with each other. The direction of current in the write bit line 5b and that in the write word line 6 flowing in the other TMR element 1b are also parallel with each other. In the following, if it is unnecessary to discriminate the current directions from each other, the write bit lines 5a and 5b will be simply referred to as the write bit lines 5. The write word line 6 is a concrete example corresponding to a "first write line" of the invention, and the write bit line 5 is a concrete example corresponding to a "second write line" of the invention.

Figure 3:
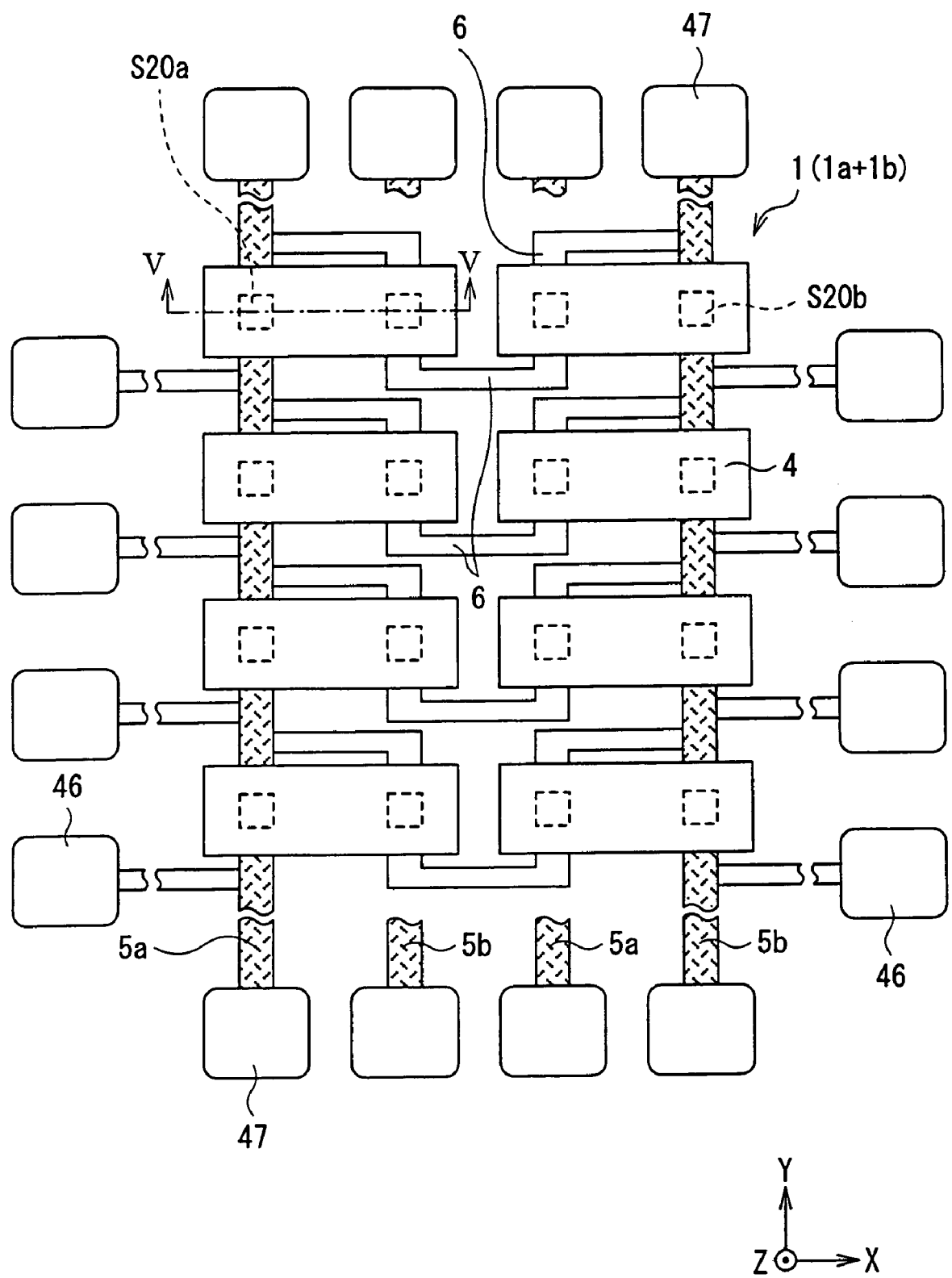
FIG. 3 is a partial plan view showing the configuration of a main part of a memory cell group in the magnetic memory device illustrated in FIG. 1.

FIG. 3 shows the configuration in plan view of the main part of the memory cell group 54 more specifically. The write bit lines 5a and 5b, write word lines 6, and memory cells 1 (TMR elements 1a and 1b) shown in FIG. 3 correspond to those in FIG. 2. The TMR elements 1a and 1b are disposed in the parallel parts 10a and 10b of the write bit lines 5a and 5b and the write word lines 6. The TMR elements 1a and 1b have stacked bodies S20a and S20b each including a magneto-sensitive layer and the magnetic yokes 4a and 4b, respectively, and the magnetization direction of the magneto-sensitive layer changes according to the magnetic field generated by the currents flowing in the write bit lines 5a and 5b and the write word lines 6 in the parallel parts 10a and 10b (that is, the external magnetic field in the magnetic yokes 4a and 4b). In this case, the write bit line 5 and the write word line 6 in the parallel parts 10a and 10b are provided in almost matched positions in the XY plane. In the Z direction, they are disposed with a predetermined interval and are electrically insulated from each other.

At both ends of each write bit line 5, write bit line lead electrodes 47 are provided. One end of each write bit line lead electrode 47 is connected to the Y-direction current drive circuit 56C and the other end is connected so as to be finally grounded. Write word line lead electrodes 46 are provided at both ends of each write word line 6. One end of each write word line lead electrode 46 is connected to the X-direction current drive circuit 58C and the other end is connected so as to be finally grounded. In FIG. 3, the write bit lines 5 are partially omitted so that the shape of the write word lines 6 can be seen well.

Figure 4:
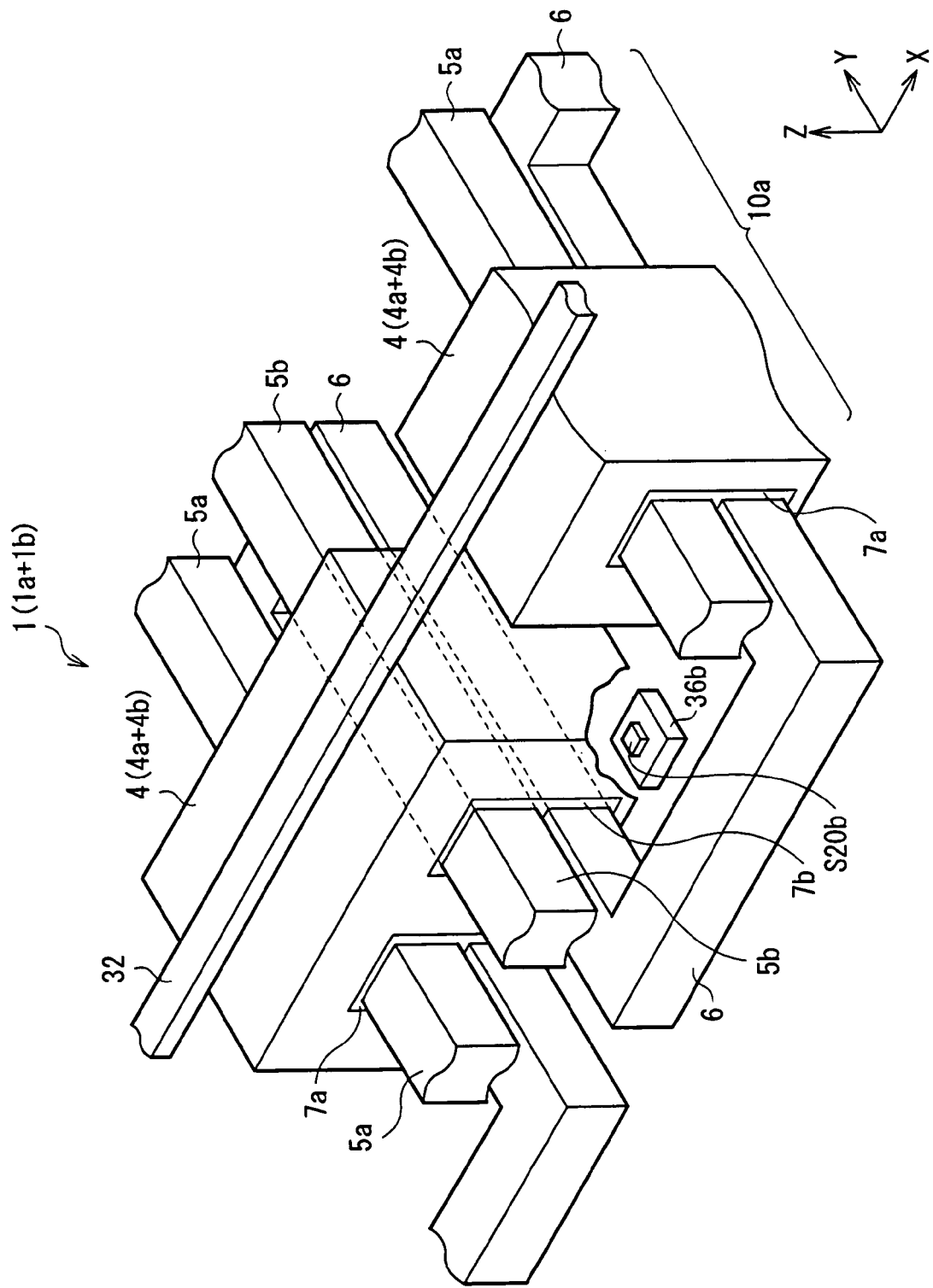
FIG. 4 is a perspective view showing the configuration of a main part of the memory cell group in the magnetic memory device illustrated in FIG. 1.

FIG. 4 is an enlarged perspective view of the memory cell 1. As shown in FIG. 4, the write word line 6, write bit lines 5a and 5b and magnetic yokes 4a and 4b are electrically insulated from each other via insulating films 7a and 7b. The stacked body S20b is formed on the surface of the magnetic yoke 4b on the side opposite to the write bit line 5b over the write word line 6. A read word line 32 is provided so as to extend in the X direction on the side opposite to the face where the stacked body S20b is formed in the magnetic yoke 4b. Although not shown in FIG. 4, the stacked body S20a corresponding to the parallel part 10a of the write bit line 5a and the write word line 6 is formed on the surface of the magnetic yoke 4a a part of which is commonly used by the magnetic yoke 4b. The pair of stacked bodies S20a and S20b are connected to conductive layers 36a and 36b formed on the side opposite to the magnetic yokes 4a and 4b (only the conductive layer 36b is shown). The pair of conductive layers 36a and 36b is a part of a pair of Schottky diodes 75a and 75b (which will be described later) and the other ends of the Schottky diodes 75a and 75b are connected to the read bit lines 33a and 33b (not shown) extending in the Y direction.

FIG. 5A shows a sectional configuration taken along line V-V of the memory cell 1 illustrated in FIG. 3. FIG. 5B shows the memory cell 1 of FIG. 5A which is conceptually divided into the TMR element 1a and the TMR element 1b.

As shown in FIGS. 5A and 5B, the TMR element 1a in the memory cell 1 has: the magnetic yoke 4a disposed in correspondence with the area (parallel part 10a) where the write bit line 5a and the write word line 6 cross each other and is constructed so as to surround the whole periphery of the write bit line 5a and the write word line 6; and the stacked body S20a including a second magnetic layer 8a as a magneto-sensitive layer of which magnetization direction changes according to an external magnetic field, magnetically coupled to the magnetic yoke 4a, and constructed so that current flows in the direction perpendicular to the stacked face. The other TMR element 1b has: the magnetic yoke 4b disposed in correspondence with the area (parallel part 10b) where the write bit line 5b and the write word line 6 cross each other and constructed so as to surround the whole periphery of the write bit line 5b and the write word line 6; and the stacked body S20b including a second magnetic layer 8b as a magneto-sensitive layer of which magnetization direction changes according to an external magnetic field, is magnetically coupled to the magnetic yoke 4b, and constructed so that current flows in the direction perpendicular to the stacked face. The TMR elements 1a and 1b share a common part 34 as a part of the magnetic yokes 4a and 4b. The second magnetic layers 8a and 8b have a coercive force larger than that of the magnetic yokes 4a and 4b, and the magnetic yokes 4a and 4b have a coercive force which increases toward the second magnetic layers 8a and 8b.

The second magnetic layers 8a and 8b as magneto-sensitive layers (also called magnetic free layers) are magnetically exchange-coupled to the connection parts 14a and 14b which constitute parts of the magnetic yokes 4a and 4b and are magnetically coupled to the stacked bodies S20a and S20b.

The stacked bodies S20a and S20b are TMR films including, in order from the side of the magnetic yokes 4a and 4b (connection parts 14a and 14b), the second magnetic layers 8a and 8b, tunnel barrier layers 3a and 3b, and first magnetic layers 2a and 2b whose magnetization direction is fixed and constructed so that current flows in the direction perpendicular to the stacked face. In FIGS. 5A and 5B, to clarify the configuration of the stacked bodies S20a and S20b, the stacked bodies S20 are exaggerated so as to be larger relative to the peripheral parts.

When the magnetization directions of the pair of TMR elements 1a and 1b are inverted in the directions which are not parallel with each other, in the common part 34, the directions of current magnetic fields generated by the write bit lines 5a and 5b and the write word line 6 become the same and the magnetic flux density increases. Consequently, the current magnetic field can be used more efficiently, and the current necessary to invert the magnetization directions of the connection parts 14a and 14b of the magnetic yokes 4a and 4b and the second magnetic layers 8a and 8b can be further decreased. Since the magnetic yoke 4 is shared, the pair of TMR elements 1a and 1b can be easily formed, the formation area of the memory cell 1 can be reduced, and capacity of stored information can be increased.

In the stacked bodies S20a and S20b, when a voltage is applied between the first magnetic layers 2a and 2b and the second magnetic layers 8a and 8b in the direction perpendicular to the stacked face, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin of the first magnetic layers 2a and 2b in the interface with the tunnel barrier layer 3 and the spin of the second magnetic layers 8a and 8b. Specifically, when the spin of the first magnetic layers 2a and 2b and that of the second magnetic layers 8a and 8b are parallel with each other, the resistance value becomes the minimum. When they are not parallel with each other, the resistance value becomes the maximum. By using the resistance values, the magneto-resistance change ratio (MR ratio) is defined as Equation (1).

$$MR\ ratio = dR/R \quad (1)$$

where "dR" denotes the difference between the resistance value in the case where the spins are parallel with each other and that in the case where the spins are not parallel with each other, and "R" indicates the resistance value in the case where the spins are parallel with each other.

The resistance value against the tunnel current (hereinbelow, called tunnel resistance Rt) strongly depends on the thickness T of the tunnel barrier layer 3. In a low voltage region, as shown in Equation (2), the tunnel resistance Rt exponentially increases with the thickness T of the tunnel barrier layer 3.

$$Rt \propto \exp(2_\chi T)_{\text{--}\chi} = \{8\pi^2 m^*(\phi \cdot Ef)^{0.5}\}/h \quad (2)$$

where $\phi$ denotes the height of the barrier, "m*" denotes effective mass of electrons, "Ef" indicates Fermi energy, and h indicates a Planck's constant. Generally, in a memory element using the TMR element, to match with a semiconductor device such as a transistor, it is said that the proper tunnel resistance Rt is about tens $k\Omega \cdot (\mu m)^2$. However, to realize higher packing density in the magnetic memory device and higher operating speed, the tunnel resistance Rt is set to, preferably, $10\ k\Omega \cdot (\mu m)^2$ or less, more preferably, $1\ k\Omega \cdot (\mu m)^2$ or less. Therefore, to realize the tunnel resistance Rt, it is desirable to set the thickness T of the tunnel barrier layer 3 to 2 nm or less, more preferably, 1.5 nm or less.

By reducing the thickness T of the tunnel barrier layers 3a and 3b, the tunnel resistance Rt can be reduced but on the other hand, a leak current occurs due to roughness of the junction interfaces with the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b have a coercive force differential structure and the coercive force of the first magnetic layers 2a and 2b is larger than that of the second magnetic layers 8a and 8b. Concretely, the coercive force of the first magnetic layer 2 is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by undesirable magnetic fields such as external scattered magnetic fields. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel with each other so that the magnetization direction of the first magnetic layers 2a and 2b and that of the second magnetic layers 8a and 8b are stabilized in a parallel or non-parallel state.

The magnetic yokes 4a and 4b extend so as to annularly surround at least a part of the parallel parts 10a and 10b in the write bit lines 5a and 5b and the write word line 6 and are constructed so that a return magnetic field is generated in the magnetic yokes 4a and 4b by current flowing in the parallel parts 10a and 10b. More specifically, as shown in FIG. 5B, the magnetic yoke 4a includes: a pair of pillar yokes 421 and 422 extending in the direction orthogonal to a stacked layer face of the stacked body S20a while facing each other over the write bit line 5a and the write word line 6; a first beam yoke 41a connected to one end on the side of the stacked body S20a of each of the pair of pillar yokes 421 and 422; and a second beam yoke 43a connected to the other end of each of the pair of pillar yokes 421 and 422. The magnetic yoke 4a has a closed sectional shape. The other magnetic yoke 4b includes: a pair of pillar yokes 422 and 423 extending in the direction orthogonal to the stacked layer face of the stacked body S20b while facing each other over the write bit line 5a and the write word line 6; a first beam yoke 41b connected to one end on the side of the stacked body S20b of the pair of pillar yokes 422 and 423; and a second beam yoke 43b connected to the other end of each of the pair of pillar yokes 422 and 423. The magnetic yoke 4b also has a closed sectional shape. The TMR elements 1a and 1b share the pillar yoke 422, a part of the first beam yokes 41a and 41b, and a part of the second beam yokes 43a and 43b and has the common part 34 as shown in FIG. 5A.

The magnetization direction of each of such magnetic yokes 4a and 4b is inverted by the return magnetic field. In this case, mainly, the second magnetic layers 8a and 8b function as storage layers for storing information. The magnetic yokes 4a and 4b are made of, for example, a metal containing at least one of nickel (Ni), iron (Fe), and cobalt (Co), and the second magnetic layers 8a and 8b have a coercive force larger than that of the magnetic yokes 4a and 4b. Consequently, even in the case where the magnetization directions of the magnetic yokes 4a and 4b become unstable due to undesirable external magnetic fields in a state where no write current flows in the write bit lines 5a and 5b and write word line 6 (not-writing operation state), the magnetization direction of the second magnetic layers 8a and 8b is not influenced and is stably held.

Further, the magnetic yokes 4a and 4b are constructed to have the coercive force which increases toward the second magnetic layers 8a and 8b. That is, the pillar yokes 421 to 423 have the coercive force larger than that of the second beam yokes 43a and 43b, and the first beam yokes 41a and 41b have the coercive force larger than that of the pillar yokes 421 to 423. The pillar yokes 421 to 423 are made of, for example, $Ni_x Fe_{1-x}$ (x=0.35 to 0.82, more preferably, x=0.7 to 0.8). The second beam yokes 43a and 43b are made of, for example, $Ni_y Fe_{1-y}$ (a composition ratio at which the coercive force is smaller than that of the pillar yokes 421 to 423 is selected from the range where y=0.7 to 0.8). Further, the first beam yokes 41a and 41b are made of a material such as cobalt, CoFe, CoPt, NiFe, NiFeCo having a coercive force smaller than that of the second magnetic layers 8a and 8b and larger than that of the pillar yokes 42₁ to 42₃. With the configuration, the magnetization directions of the first beam yokes 41a and 41b positioned closest to the second magnetic layers 8a and 8b in the magnetic yokes 4a and 4b, respectively, can be more stabilized, so that the magnetization directions of the second magnetic layers 8a and 8b can be stably held without being disturbed. That is, at the time of non-writing operation, the magnetization direction of the first magnetic layers 2a and 2b and that of the second magnetic layers 8a and 8b can be stably held in a non-parallel state. By suppressing the coercive force of the second beam yokes 43a and 43b to be relatively small, which are in the position furthest from the second magnetic layers 8a and 8b and exert small influence on the magnetization direction of the second magnetic layers 8a and 8b, write current necessary to invert the magnetization at the time of writing operation can be suppressed. As the material applied for the magnetic yokes 4a and 4b, in addition to the above-described materials, for example, an FeAlSi-based alloy can be mentioned.

Preferably, the coercive force of the connection parts 14a and 14b is smaller than that of the first magnetic layers 2a and 2b within the range of $(100/4\pi) \times 10^3$ A/m or less for the following reason. When the coercive force exceeds $(100/4\pi) \times 10^3$ A/m, there is the possibility that the stacked bodies S20a and S20b themselves as the TMR films deteriorate due to heat generation caused by increase in write current. Further, when the coercive force of the connection parts 14a and 14b is equal to or larger than that of the first magnetic layers 2a and 2b, the write current increases, the magnetization direction of the first magnetic layers 2a and 2b as the magnetization fixed layers changes, and the stacked bodies S20a and S20b as storage elements are destroyed. To make the current magnetic fields by the write bit lines 5a and 5b and the write word line 6 concentrated on the magnetic yokes 4a and 4b, the magnetic permeability of the magnetic yokes 4a and 4b is preferably high. Concretely, the magnetic permeability is preferably 2000 or higher and, more preferably, 6000 or higher.

Each of the write bit line 5 and the write word line 6 has a structure in which a film of titanium (Ti) having a thickness of 10 nm, a film of titanium nitride (TiN) having a thickness of 10 nm, and a film of aluminum (Al) having a thickness of 500 nm are sequentially stacked and are electrically insulated from each other via the insulating films 7. The write bit line 5 and the write word line 6 may be made of at least one of, for example, aluminum (Al), copper (Cu), and tungsten (W). A more concrete operation of writing information to the memory cell 1 by using the write bit line 5 and the write word line 6 will be described later.

Figure 6:
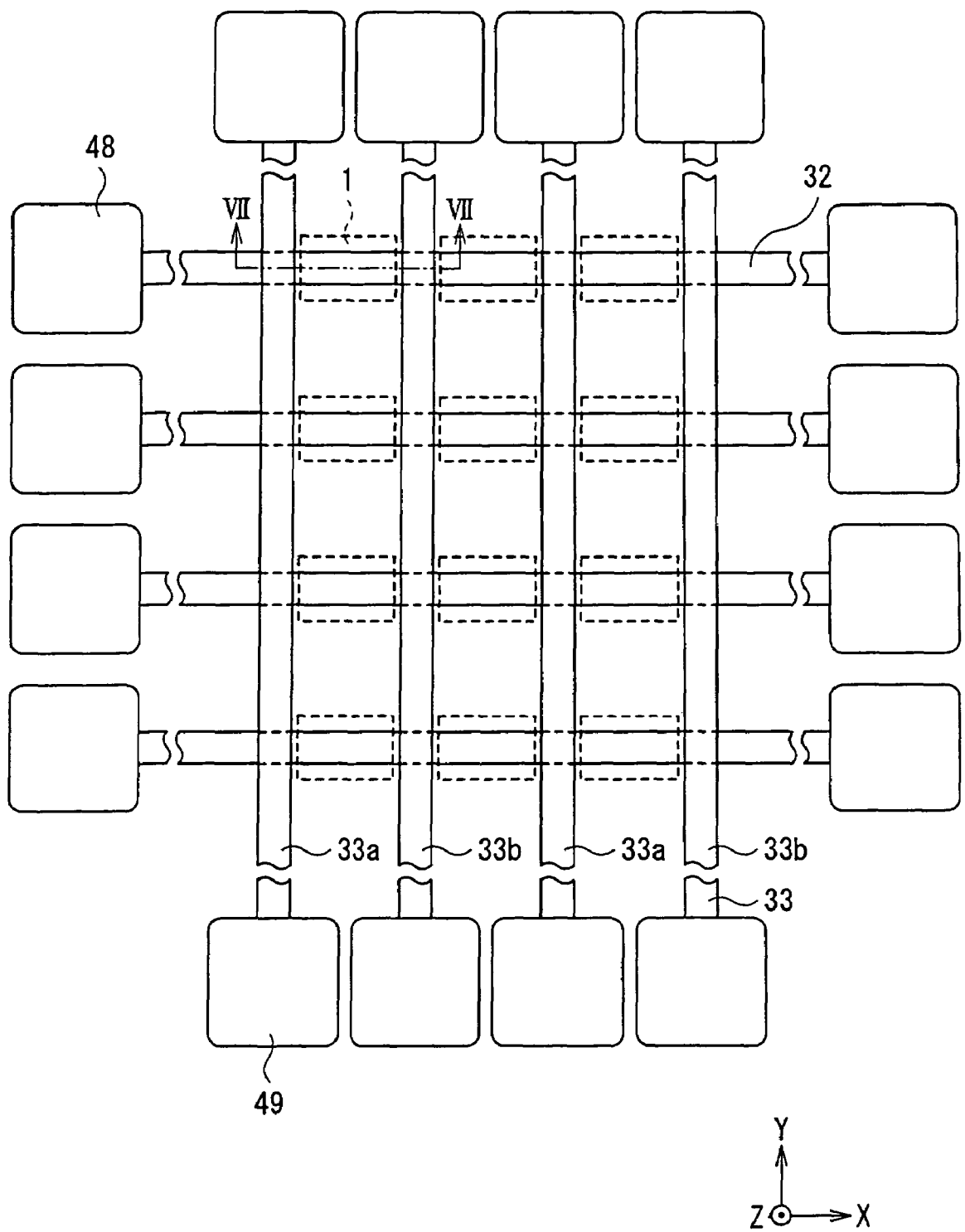
FIG. 6 is another partial plan view showing the configuration of the main part of the memory cell group in the magnetic memory device illustrated in FIG. 1.

The configuration related to information reading operation will now be described. FIG. 6 is a plan view showing the configuration of a main part related to the reading operation of the memory cell group 54 and corresponds to FIG. 3.

As shown in FIG. 6, each memory cell 1 is disposed at each of the intersecting points of the plurality of read word lines 32 and the plurality of read bit lines 33 in the XY plane. The stacked bodies S20a and S20b on the under face of the memory cell 1 are connected to a pair of read bit lines 33a and 33b via the Schottky diodes 75a and 75b, and the top face (the side opposite to the stacked bodies S20a and S20b)is in contact with the read word line 32. The read bit lines 33a and 33b supply read current to the pair of TMR elements 1a and 1b in each memory cell 1 and the read word line 32 leads the read current passed to the TMR elements 1a and 1b to the ground. At both ends of each read bit line 33, read bit line lead electrodes 49 are provided. On the other hand, at both ends of each read word line 32, read bit line lead electrodes 48 are provided.

Figure 7:
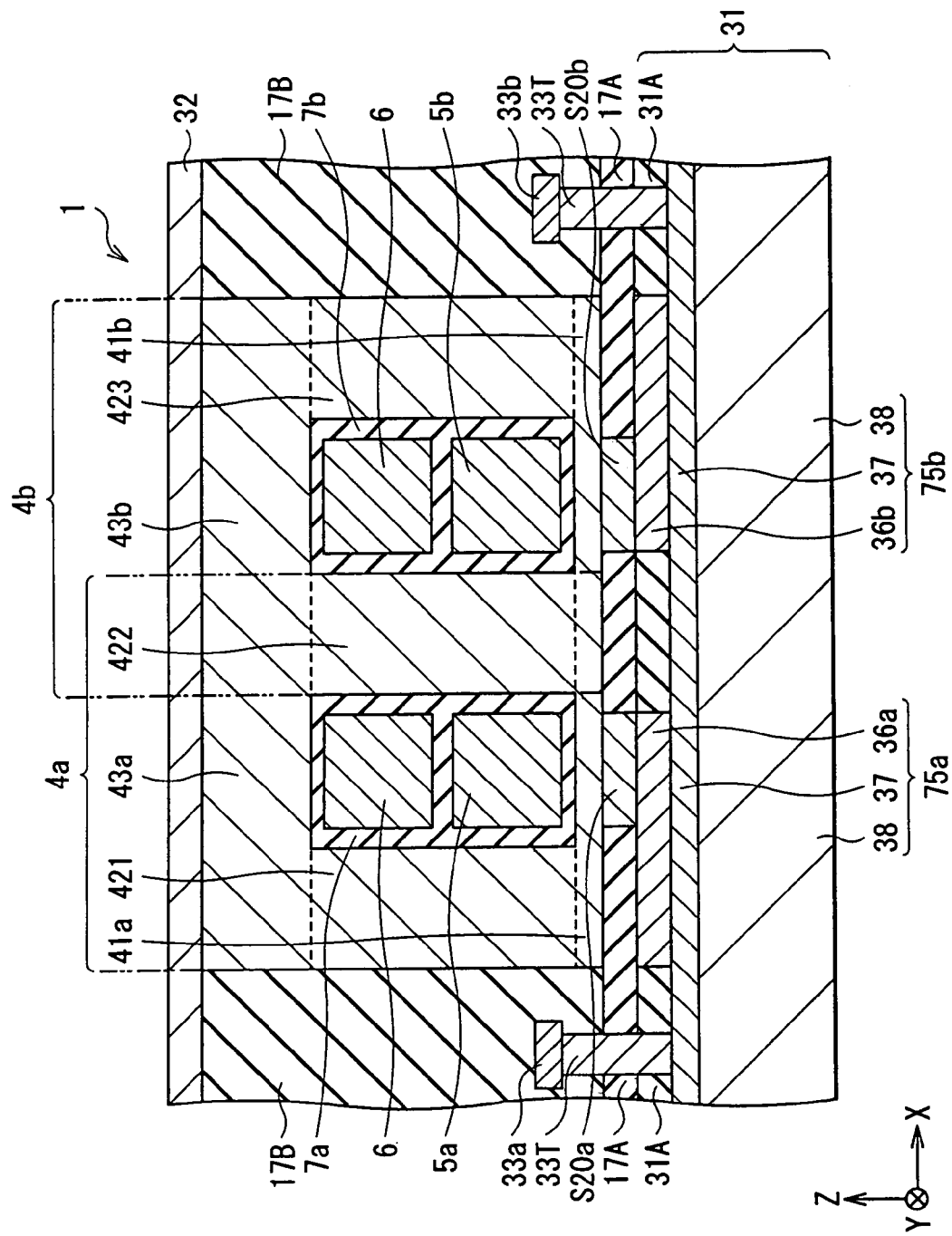
FIG. 7 is a cross section showing the configuration of a plane taken along line VII-VII of the memory cell illustrated in FIG. 6.

FIG. 7 is a cross section taken along line VII-VII of FIG. 6. As shown in FIG. 7, a magnetic memory device of the embodiment is constructed so that, in a region including the memory cell 1, a pair of stacked bodies S20a and S20b and the magnetic yokes 4a and 4b are sequentially formed on a substrate 31 provided with the Schottky diode 75 (hereinbelow, simply called diode 75) functioning as a rectifier.

The pair of diodes 75a and 75b have the conductive layers 36a and 36b, an epitaxial layer 37, and a substrate 38 in order from the side of the stacked bodies S20a and S20b. Between the conductive layers 36a and 36b and the epitaxial layer 37, a Schottky barrier is formed. The diodes 75a and 75b do not have parts electrically connected to each other except for connection to the annular magnetic layer 4 while sandwiching the stacked bodies S20a and S20b. The substrate 38 is an n-type silicon wafer. Generally, in the n-type silicon wafer, an impurity of phosphorus (P) is diffused. As the substrate 38, a wafer of an $n^{++}$ type obtained by being highly doped with phosphorus is used. As the epitaxial layer 37, a wafer of the n-type obtained by being lightly doped with phosphorus is used. By making the epitaxial layer 37 as an n-type semiconductor and the conductive layers 36a and 36b made of a metal come into contact with each other, a band gap is created and a Schottky barrier is formed. Further, the pair of diodes 75a and 75b are connected to the read bit lines 33a and 33b, respectively, via a connection layer 33T.

Figure 8:
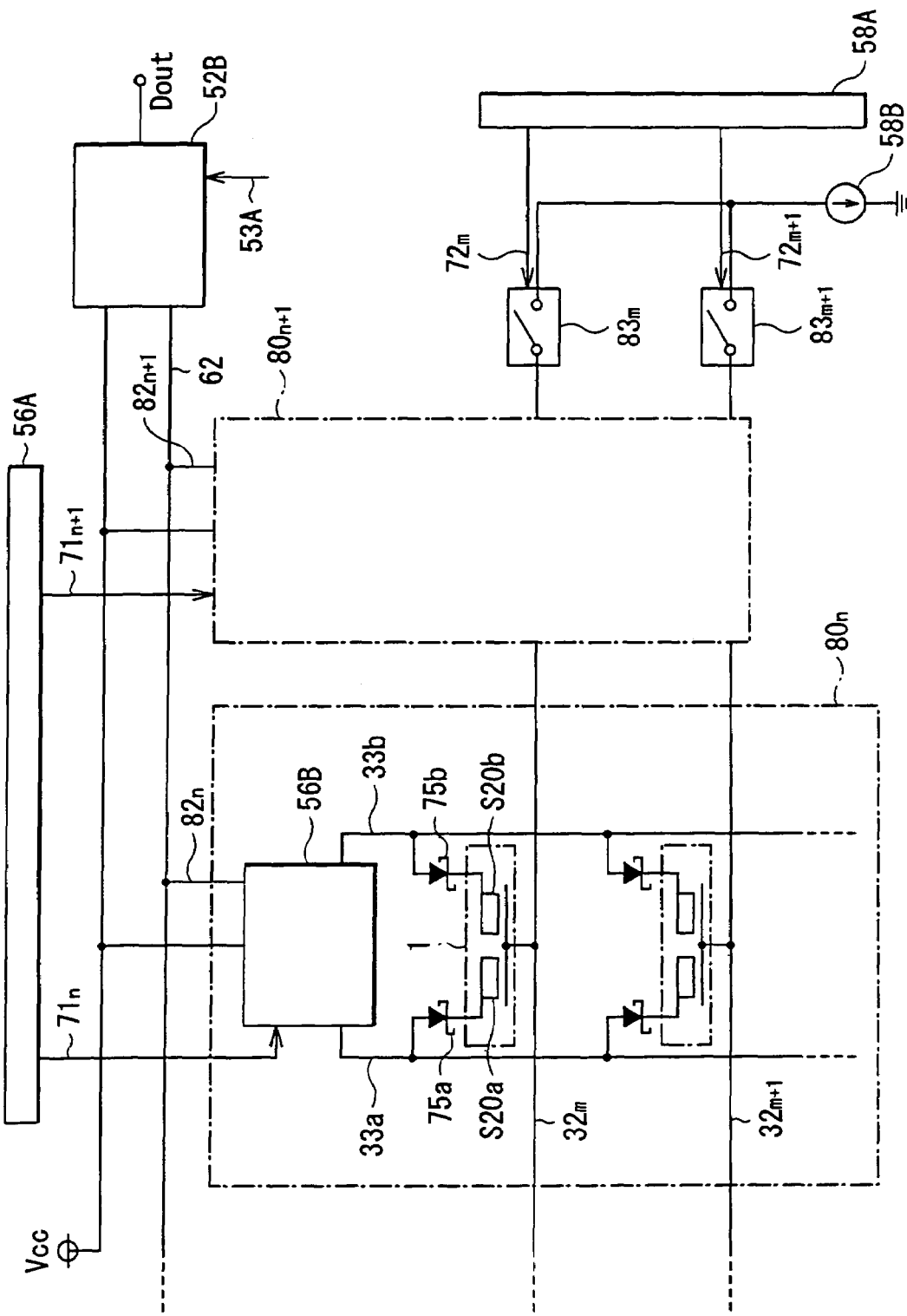
FIG. 8 is a circuit diagram showing the circuit configuration of the magnetic memory device illustrated in FIG. 1.

Referring now to FIG. 8, the circuit configuration related to the reading operation in the magnetic memory device of the embodiment will be described.

FIG. 8 is a configuration diagram of a circuit system constructed by the memory cell group 54 and a read circuit. In the read circuit system, the memory cell 1 is of a differential amplifier type constructed by the pair of TMR elements 1a and 1b. Information in the memory cell 1 is read by outputting a differential value of read currents passed to the TMR elements 1a and 1b (currents passed from the read bit lines 33a and 33b to the TMR elements 1a and 1b and output to the common read word line 32).

In FIG. 8, a unit read circuit 80 (..., 80n, 80n+1, ...) as a unit of repetition of the read circuit is constructed by the memory cells 1 of each bit line in the memory cell group 54 and a part of the read circuit including the sense amplification circuit 56B, and the unit read circuits 80n are arranged in the bit line direction. Each of the unit read circuits 80n is connected to the Y-direction address decoder circuit 56A via the bit decode line 71 (..., 71n, 71n+1, ...) and is connected to the output buffer 52B via the Y-direction read data bus 62.

In the memory cell group 54, the read word lines 32 (..., 32m, 32m+1, ...) arranged in the X direction and the pair of read bit lines 33a and 33b arranged in the Y direction are disposed in a matrix. Each of the memory cells 1 is disposed at the intersecting point with the read line 32 in a region sandwiched by the pair of read bit lines 33a and 33b. Each one end of the TMR elements 1a and 1b in each memory cell 1 is connected to the read bit lines 33a and 33b via the pair of diodes 75a and 75b, respectively, and each of the other end is connected to the common read word line 32.

One end of each read word line 32 is connected to a read switch 83 (..., $83_m$, $83_{m+1}$, ...) via the read word line lead electrode 48 and is also connected to a common constant current circuit 58B. Each read switch 83 is connected to the X-direction address decoder circuit 58A via the word decode line 72 (..., $72_m$, $72_{m+1}$, ...). The read switch 83 is made conductive when a selection signal from the X-direction address decoder circuit 58A is supplied. The constant current circuit 58B has the function of making the current flowing in the read word line 32 constant.

One end of each read bit line 33 is connected to the sense amplification circuit 56B via the read bit line lead electrode 49, and the other end is finally grounded. One sense amplification circuit 56B is provided per unit read circuit 80 and has the function of receiving the potential difference between the pair of read bit lines 33a and 33b in each unit read circuit 80 and amplifying the potential difference. The sense amplification circuit 56B is connected to the output line 82 ( . . . , 82n, 82n+1, . . . ) and is finally connected to the output buffer 52B via the Y-direction read data bus 62.

The operation in the magnetic memory device of the embodiment will now be described.

Figure 9A:
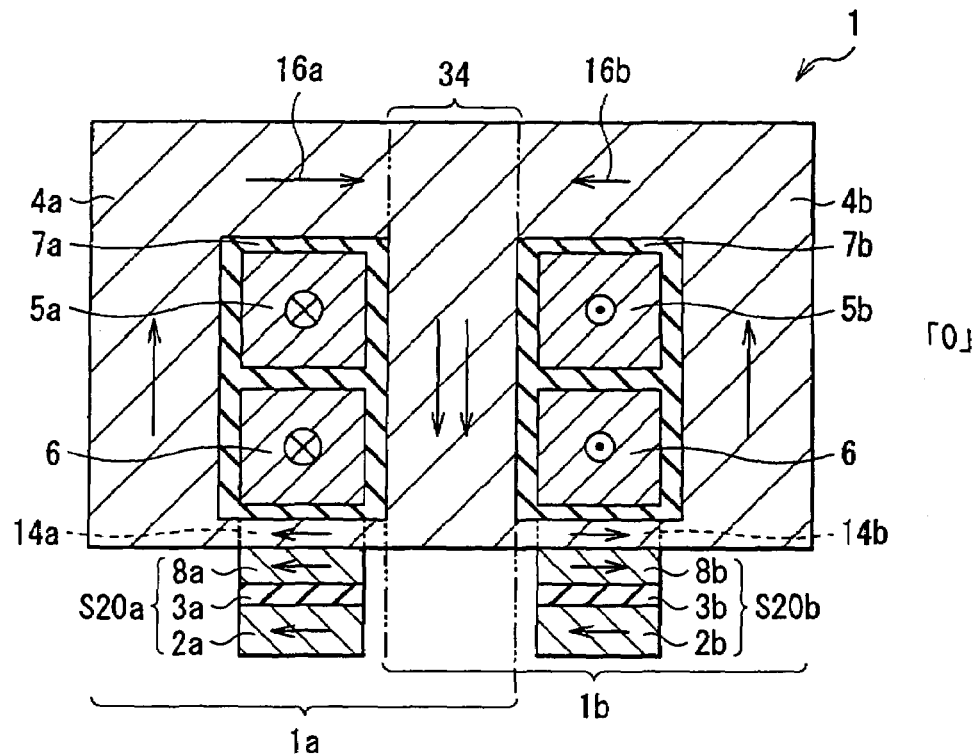
FIGS. 9A and 9B are diagrams showing the relation between a write current direction and a return magnetic field direction (magnetization direction) in the sectional configuration of the memory cell illustrated in FIGS. 5A and 5B.
Figure 9B:
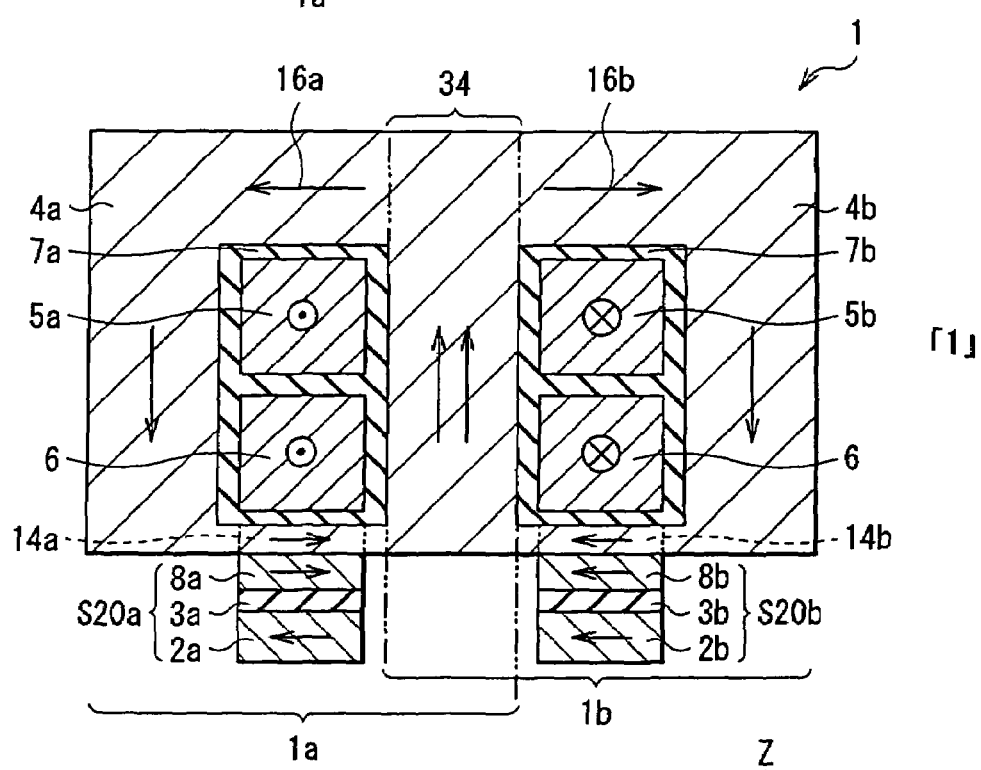

Referring now to FIG. 2 and FIGS. 9A and 9B, the writing operation in the memory cell 1 will be described. FIGS. 9A and 9B express the relation between the write current direction and the return magnetic field direction (magnetization direction) in the sectional configuration of the memory cell 1 shown in FIG. 5. The arrows indicated in magnetic layers in FIGS. 9A and 9B indicate the magnetization directions of the magnetic layers. With respect to the magnetic yokes 4a and 4b, the magnetic field directions of a magnetic path formed on the inside are also shown. The magnetization of the first magnetic layers 2a and 2b is fixed to the −X direction. FIGS. 9A and 9B show the case where write current flows in the same direction to the write bit line 5 and the write word line 6 which extend in the memory cell 1 and are parallel with each other. FIG. 9A corresponds to the write current direction shown in FIG. 2. FIG. 9A shows a case where write current flows from this side to the depth in the direction perpendicular to the drawing sheet (to the +Y direction) in the TMR element 1a, a return magnetic field 16a is generated in the clockwise direction in the magnetic yoke 4a of the portion surrounding the write bit line 5a, write current flows from the depth to this side in the direction perpendicular to the drawing sheet (to the −Y direction) in the TMR element 1b, and the return magnetic field 16b is generated in the counterclockwise direction in the magnetic yoke 4b of the portion surrounding the write bit line 5b. In this case, the magnetization direction of the connection part 14a and the second magnetic layer 8a is the −X direction and the magnetization direction of the connection part 14b and the second magnetic layer 8b is the +X direction. FIG. 9B corresponds to the case where the directions of current flowing in the write bit line 5 and the write word line 6 are opposite to those shown in FIG. 9A. Specifically, FIG. 9B shows a case where write current flows from the depth to this side in the direction perpendicular to the drawing sheet (to the −Y direction) in the TMR element 1a, the return magnetic field 16a is generated in the counterclockwise direction in the magnetic yoke 4a of the portion surrounding the write bit line 5a, write current flows from this side to the depth in the direction perpendicular to the drawing sheet (to the +Y direction) in the TMR element 1b, and the return magnetic field 16b is generated in the clockwise direction in the magnetic yoke 4b of the portion surrounding the write bit line 5b. In this case, the magnetization direction of the connection part 14a and the second magnetic layer 8a is the +X direction and the magnetization direction of the connection part 14b and the second magnetic layer 8b is the −X direction.

In the cases of FIGS. 9A and 9B, the current direction of the write bit line 5a and the write word line 6 penetrating the TMR element 1a and that of the write bit line 5b and the write word line 6 penetrating the TMR element 1b are opposite to each other. Consequently, the directions of the return magnetic fields 16a and 16b flowing in the pillar yoke 422 (refer to FIG. 5) corresponding to the common part 34 of the magnetic yokes 4a and 4b can be made the same (the +Z direction in FIG. 9A and the −Z direction in FIG. 9B).

As obvious from FIGS. 9A and 9B, according to the directions of the return magnetic field 16a and 16b generated by the currents flowing in the write bit line 5 and the write word line 6 penetrating the magnetic yokes 4a and 4b, the magnetization direction of the connection part 14a and the second magnetic layer 8a and that of the connection part 14b and the second magnetic layer 8b change so as to be opposite to each other. By using the phenomenon, information can be stored in the memory cell 1.

In short, when current flows in the same direction in the write bit lines 5a and 5b and the write word line 6, the magnetization directions of the magnetic yokes 4a and 4b are inverted and, accompanying the inversion, the magnetization directions of the second magnetic layers 8a and 8b change, thereby enabling binary information of "0" or "1" to be stored. In the case where "0" corresponds to, for example, the state of FIG. 9A, specifically, the state where the connection part 14a and the second magnetic layer 8a are magnetized in the −X direction and the other connection part 14b and the second magnetic layer 8b are magnetized in the +X direction, "1" corresponds to the state of FIG. 9B, specifically, the state where the connection part 14a and the second magnetic layer 8a are magnetized in the +X direction and the other connection part 14b and the second magnetic layer 8b are magnetized in the −X direction. In such a manner, information can be stored.

In this case, in the TMR elements 1a and 1b, when the magnetization direction of the first magnetic layers 2a and 2b and that of the second magnetic layers 8a and 8b are the same, a low resistance state in which large tunnel current flows is obtained. When they are different from each other, a high resistance state in which only small tunnel current flows is obtained. That is, one of the pair of TMR elements 1a and 1b is always in the low resistance state and the other is in the high resistance state, thereby storing information. In the case where the write currents flow in the opposite directions in the write bit line 5 and the write word line 6 or in the case where the write current flows in only one of the write bit line 5 and the write word line 6, the magnetization direction of the second magnetic layer 8 is not inverted and the data is not rewritten.

In the memory cell 1 in the magnetic memory device of the embodiment having the configuration as described above, by passing the currents in the same direction to both of the write bit line 5 and the write word line 6, the direction of the current magnetic field generated by the write bit line 5 and that of the current magnetic field generated by the write word line 6 become the same in the magnetic yoke 4, so that a synthetic magnetic field can be generated. Consequently, as compared with the case where the magnetic yoke 4 is not provided and the case where the write bit line 5 and the write word line 6 perpendicularly cross each other, higher magnetic flux density is obtained. Thus, the current magnetic field can be used more efficiently and the current necessary to invert the magnetization in the second magnetic layer 8 can be more reduced.

Further, since the second magnetic layer 8 is provided between the tunnel barrier layer 3 and the connection part 14 of the magnetic yoke 4, the following advantages are obtained. Exchange coupling between the connection part 14 and the second magnetic layer 8 can be formed and the magnetization direction in the second magnetic layer 8 is aligned more excellently, so that more stable writing can be performed. Further, the coercive force of the connection part 14 can be suppressed more, so that a heat generation amount can be decreased by reducing the current value in the writing operation, and the functions of the magnetic memory device can be fully displayed.

Referring now to FIGS. 1 and 8, the reading operation in the magnetic memory device of the embodiment will be described.

First, one of the plurality of bit decode lines 71 is selected by the address decoder circuit 56A in the first drive control circuit part 56 and a control signal is transmitted to the corresponding sense amplification circuit 56B. As a result, read current flows in the read bit lines 33a and 33b and the positive potential is given to the side of the stacked bodies S20a and S20b in the TMR elements 1a and 1b. Similarly, by the X-direction address decoder circuit 58A in the second drive control circuit part 58, one of the plurality of word decode lines 72 is selected and the read switch 83 in the corresponding part is driven. The selected read switch 83 is made conductive, read current flows in the corresponding read word line 32, and a negative potential is given to the side opposite to that of the stacked bodies S20a and S20b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read.

Figure 10A:
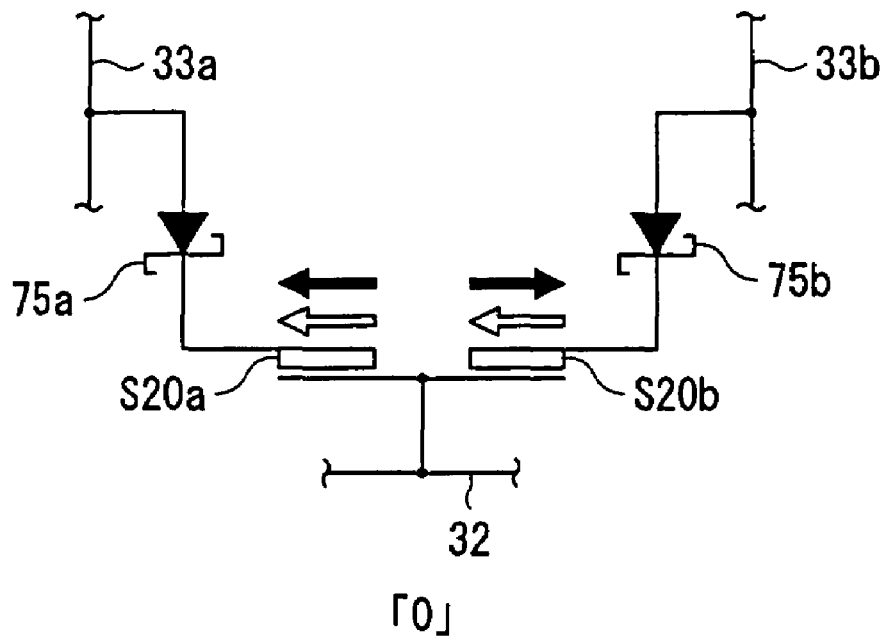
FIGS. 10A and 10B are partial enlarged views of the circuit configuration illustrated in FIG. 8.
Figure 10B:
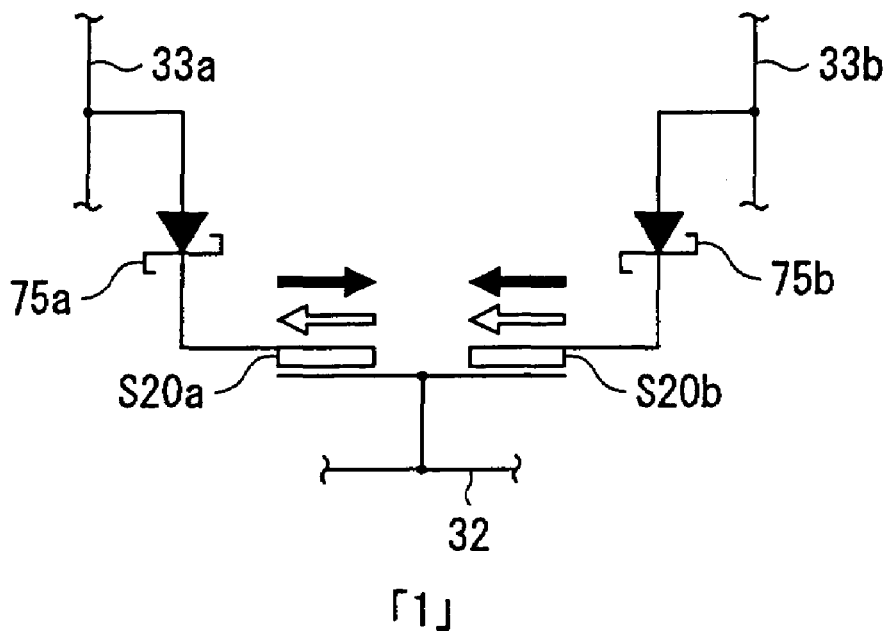

FIGS. 10A and 10B are circuit diagrams each showing a portion around the memory cell 1. The magnetization directions of the first magnetic layers 2a and 2b in the stacked bodies S20a and S20b are indicated by hollow arrows and those of the second magnetic layers 8a and 8b are indicated by solid arrows. Both of the magnetization directions of the first magnetic layers 2a and 2b are fixed to the left directions. In FIG. 10A, the magnetization direction of the first magnetic layer 2a and that in the second magnetic layer 2b in the stacked body S20a are the same, and the magnetization direction of the first magnetic layer 2b and that of the second magnetic layer 2b in the other stacked body S20b are opposite to each other. In this case, the stacked body S20a is in the low resistance state, and the stacked body S20b is in the high resistance state. This case corresponds to, for example, "0". In the other case of FIG. 10B, different from the case of FIG. 10A, the stacked body S20a is in the high resistance state and the stacked body S20b is in the low resistance state. This case corresponds to, for example, "1". Such binary information can be obtained by utilizing the fact that the resistance values of the stacked bodies S20a and S20b are different from each other and detecting the difference between the current values.

In the magnetic memory device of the embodiment, with the configuration as described below, by passing current to both of the write bit line 5 and the write word line 6, a closed magnetic path can be formed, the magnetization can be inverted efficiently in the magnetic yokes 4a and 4b in the TMR elements 1a and 1b, and the magnetic influence on a memory cell adjacent to the memory cell 1 to be subject to writing can be reduced. Further, by the shield effect of the magnetic yokes 4a and 4b, the intervals of neighboring memory cells can be narrowed on the substrate. Thus, it is advantageous for higher integration and higher packing density of the magnetic memory device.

In the embodiment, the pillar yokes 421 to 423 have the coercive force larger than that of the second beam yokes 43a and 43b, and the first beam yokes 41a and 41b have the coercive force larger than that of the pillar yokes 421 to 423. Thus, in non-writing operation (in a state where no write current flows), the influence of remanent magnetization in the magnetic yokes 4a and 4b can be prevented from being exerted on the second magnetic layers 8a and 8b. If the magnetic yokes 4a and 4b have the coercive force equal to or larger than that of the second magnetic layers 8a and 8b, there is the possibility that the remanent magnetization in the magnetic yokes 4a and 4b act on the second magnetic layers 8a and 8b and disturb the magnetization directions of the second magnetic layers 8a and 8b in non-writing operation. In particular, the direction of remanent magnetization in the pillar yokes 421 to 423 and the second beam yokes 43a and 43b is largely different from the magnetization direction of the second magnetic layers 8a and 8b to be held. Consequently, in the case where the pillar yokes 421 to 423 and the second beam yokes 43a and 43b have the largest coercive force, the possibility that the magnetization directions of the second magnetic layers 8a and 8b are disturbed is higher. If the magnetic yokes 4a and 4b are arranged to have the coercive force larger than that of the second magnetic layers 8a and 8b, at the time of forming the return magnetic fields 16a and 16b for inverting the magnetization of the second magnetic layers 8a and 8b as a storage layer for storing information, a larger write current is required, and write efficiency deteriorates. In contrast, in the embodiment, the magnetic yokes 4a and 4b have the coercive force which is smaller than that of the second magnetic layers 8a and 8b and increases toward the second magnetic layers 8a and 8b, so that the magnetization directions of the second magnetic layers 8a and 8b can be stably held. As a result, a read error caused by unintentional magnetization inversion in the second magnetic layers 8a and 8b can be prevented.

A method of manufacturing the magnetic memory cell of the embodiment having the configuration as described above and a method of manufacturing the magnetic memory device will now be explained.

A method of manufacturing, mainly, the magnetic memory cell 1 in the magnetic memory device will be concretely described hereinbelow with reference to FIGS. 11 to 27. FIGS. 11 to 27 are cross sections corresponding to FIG. 7 and show manufacturing processes in order.

Figure 11:
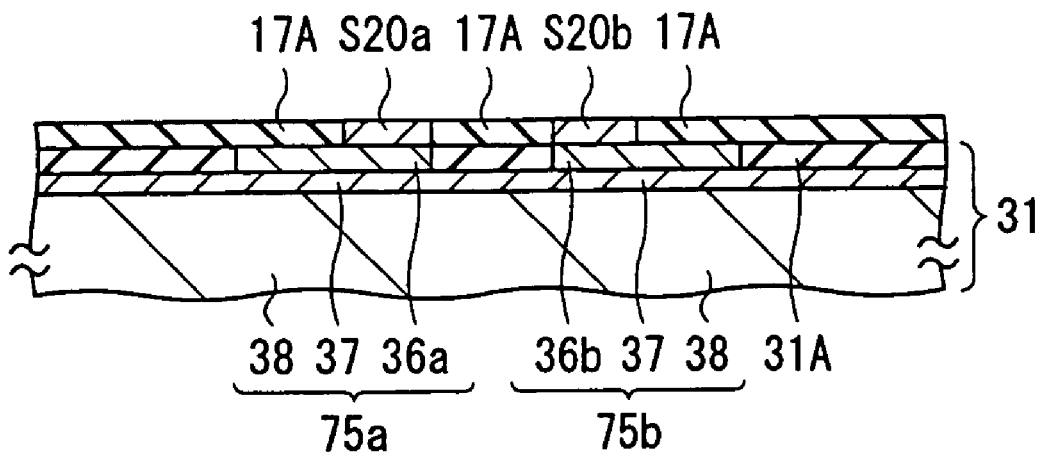
FIG. 11 is an enlarged cross section showing a process in a method of manufacturing the magnetic memory device illustrated in FIG. 1.
Figure 12:
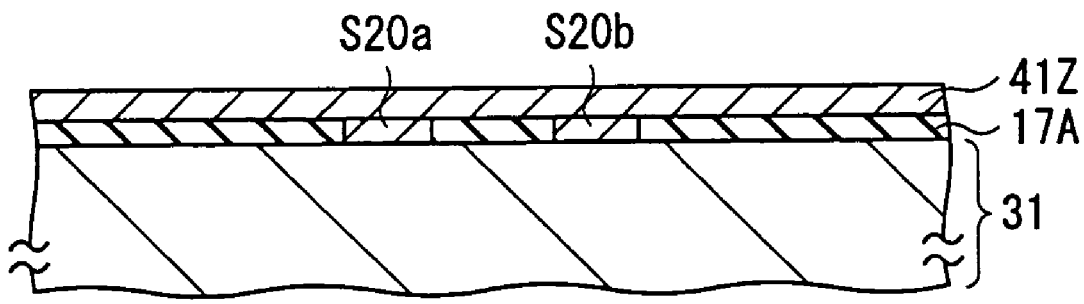
FIG. 12 is an enlarged cross section showing a process subsequent to FIG. 11.
Figure 13:
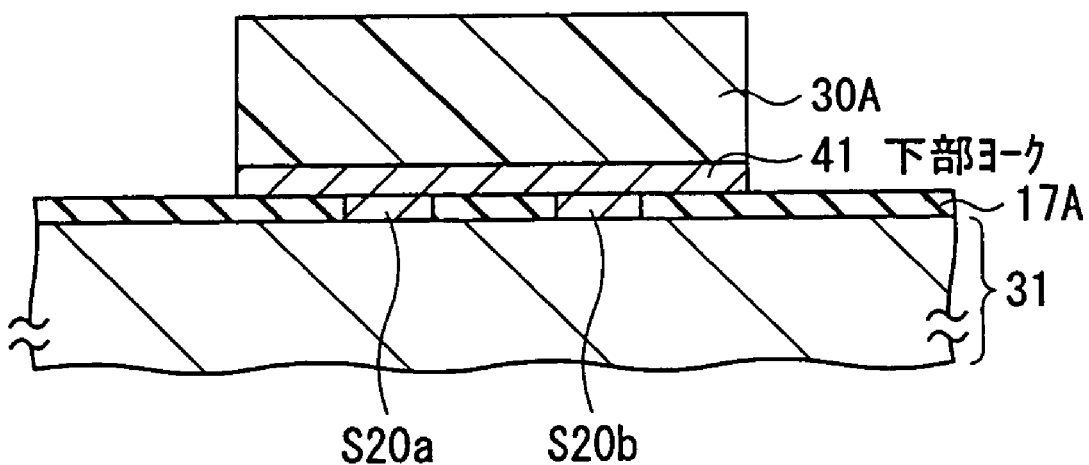
FIG. 13 is an enlarged cross section showing a process subsequent to FIG. 12.

In the first process, a first beam yoke 41 is formed on the substrate 31 via the stacked bodies S20a and S20b. First, as shown in FIG. 11, the substrate 31 in which the diodes 75a and 75b are buried and on which the stacked bodies S20a and S20b and the insulating film 17A surrounding the stacked bodies S20a and S20b are formed is prepared. In FIGS. 12 to 27 subsequent to FIG. 11, the details of the substrate 31 will be omitted. Subsequently, as shown in FIG. 12, a metal film 41Z made of a predetermined metal is formed by, for example, sputtering on the entire surface. After that, as shown in FIG. 13, a resist pattern 30A in a predetermined shape is formed on the metal film 41Z of the region corresponding to the stacked bodies S20a and S20b. By removing the unnecessary metal film 41Z by milling or the like, the first beam yoke 41 (41a and 41b) is obtained. Generally, such a thin film patterning method is called milling.

Figure 14:
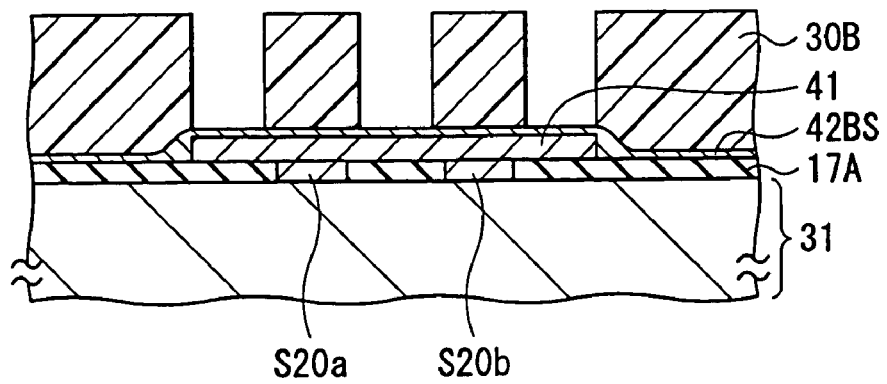
FIG. 14 is an enlarged cross section showing a process subsequent to FIG. 13.
Figure 15:
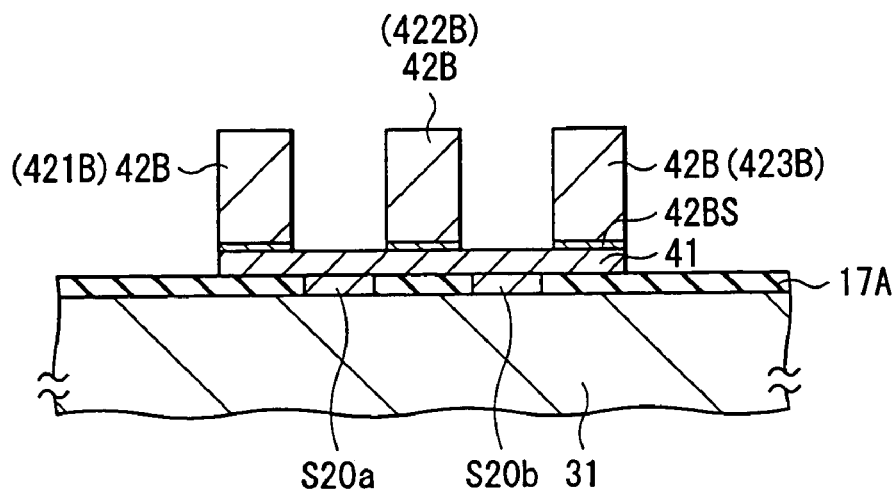
FIG. 15 is an enlarged cross section showing a process subsequent to FIG. 14.

In the following second process, on the first beam yoke 41, three bottom pillar yokes 42B (421B, 422B, and 423B) are formed. First, the resist pattern 30A is removed and, as shown in FIG. 14, an underplating film 42BS made of $Ni_{0.5}Fe_{0.5}$ is formed on the entire surface by, for example, sputtering. On the underplating film 42BS, a resist pattern 30B is selectively formed. In this case, the resist pattern 30B is not formed in a region for forming the bottom pillar yoke 42B. After that, the resultant is soaked in a plating bath and a plating process using the underplating film 42BS as an electrode is performed, thereby forming the three bottom pillar yokes 42B made of, for example, $Ni_{0.5}Fe_{0.5}$ as shown in FIG. 15. After forming the bottom pillar yokes 42B, the resist pattern 30B is peeled off, and the exposed underplating film 42BS is removed by milling or the like. Generally, such a thin film patterning method is called a frame plating method.

Figure 16:
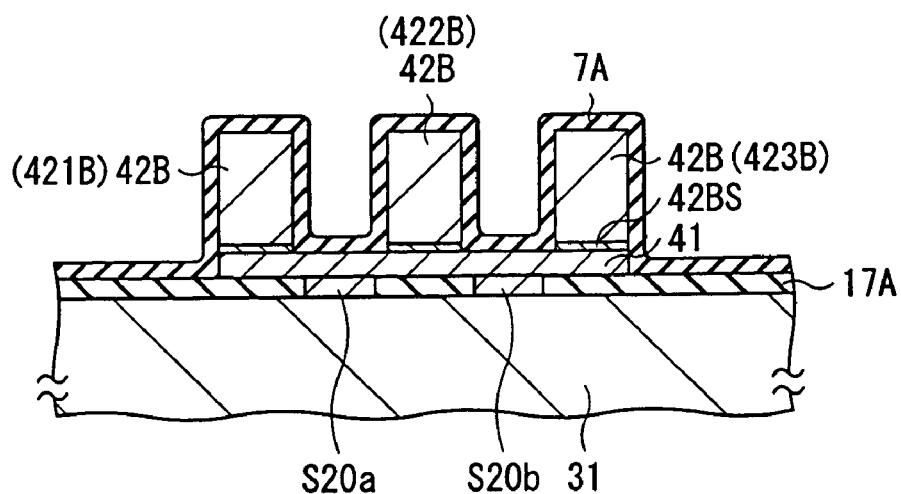
FIG. 16 is an enlarged cross section showing a process subsequent to FIG. 15.
Figure 17:
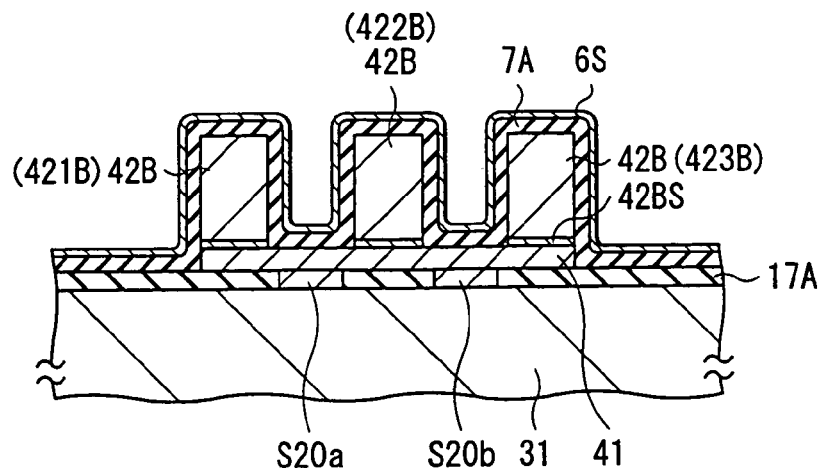
FIG. 17 is an enlarged cross section showing a process subsequent to FIG. 16.
Figure 18:
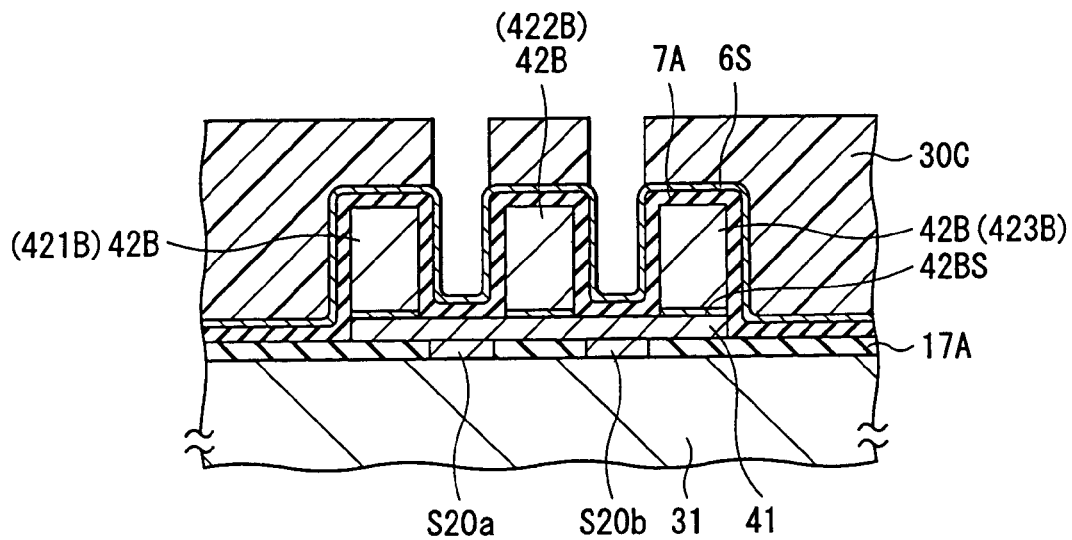
FIG. 18 is an enlarged cross section showing a process subsequent to FIG. 17.
Figure 19:
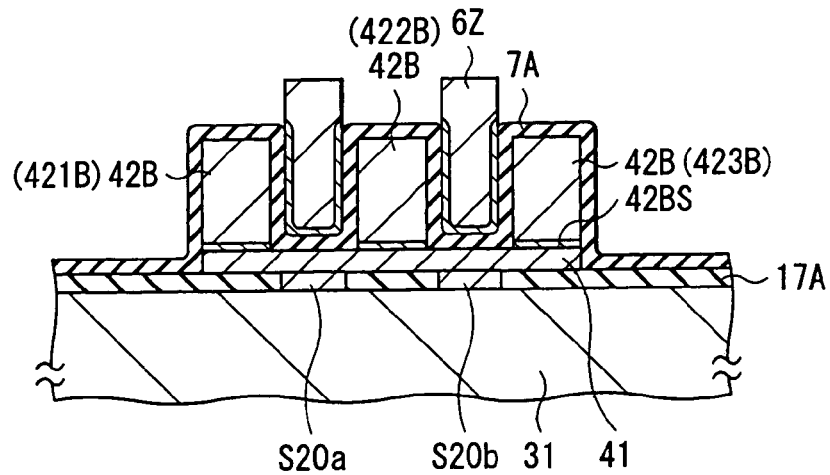
FIG. 19 is an enlarged cross section showing a process subsequent to FIG. 18.
Figure 20:
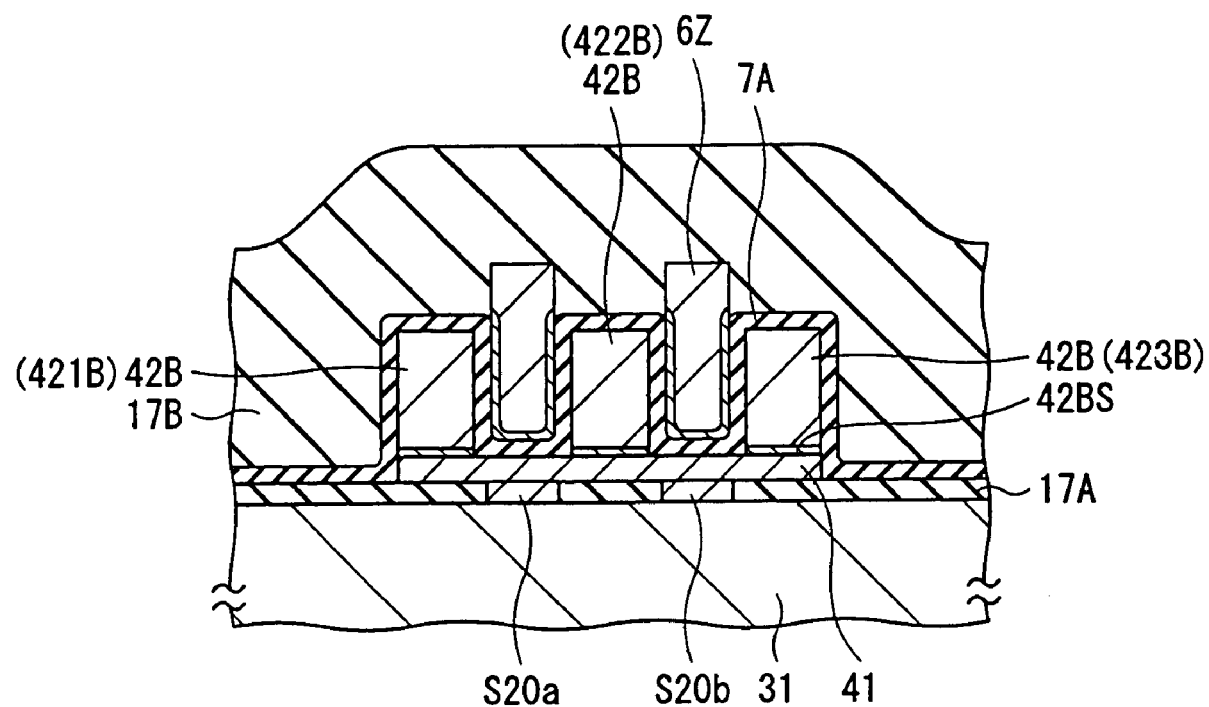
FIG. 20 is an enlarged cross section showing a process subsequent to FIG. 19.
Figure 21:
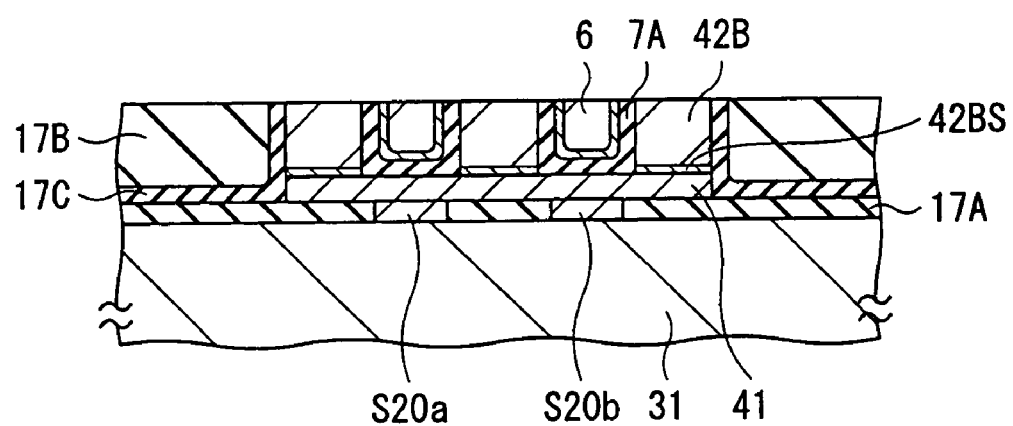
FIG. 21 is an enlarged cross section showing a process subsequent to FIG. 20.

In the following third process, the write word lines 6 are formed between the bottom pillar yokes 42B via insulating films 7A. In this case, first, as shown in FIG. 16, the insulating film 7A made of $Al_2O_3$ or the like is formed so as to cover the whole by using, for example, a CVD apparatus. After that, as shown in FIG. 17, an underplating film 6S made of, for example, copper is formed so as to cover the insulating film 7A by sputtering or the like. After that, as shown in FIG. 18, a resist pattern 30C is selectively formed so as to leave the region between the bottom pillar yokes 42B. Further, as shown in FIG. 19, a metal layer 6Z is formed so as to bury at least the regions between the bottom pillar yokes 42B. In this case, the resultant is soaked in a plating bath and a plating process using the underplating film 6S as an electrode is performed, thereby forming the metal layer 6Z made of copper. The resist pattern 30C is peeled off and the exposed underplating film 6S is removed by milling or the like. As shown in FIG. 20, an insulating film 17B made of, for example, $Al_2O_3$ is formed so as to cover the whole by sputtering or the like. After that, as shown in FIG. 21, the whole face is polished to a predetermined thickness so as to be planarized by using, for example, a CMP apparatus. In such a manner, the write word line 6 is formed.

Figure 22:
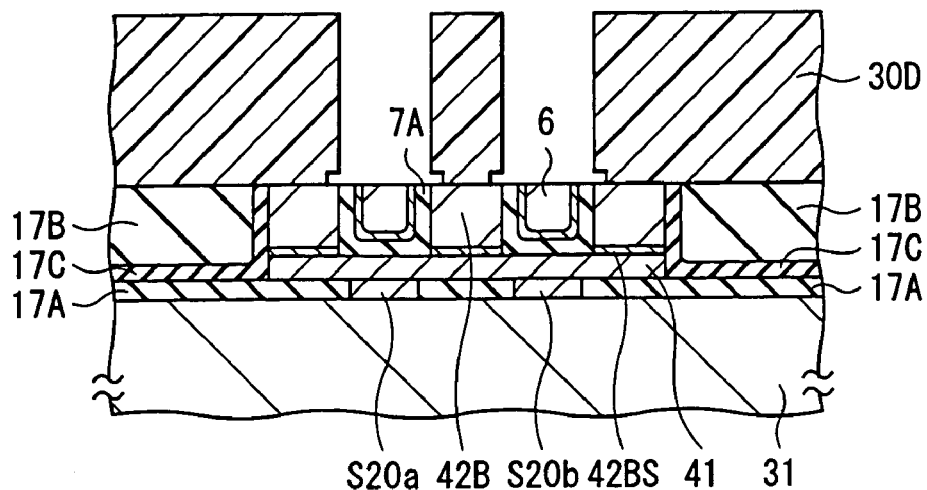
FIG. 22 is an enlarged cross section showing a process subsequent to FIG. 21.
Figure 23:
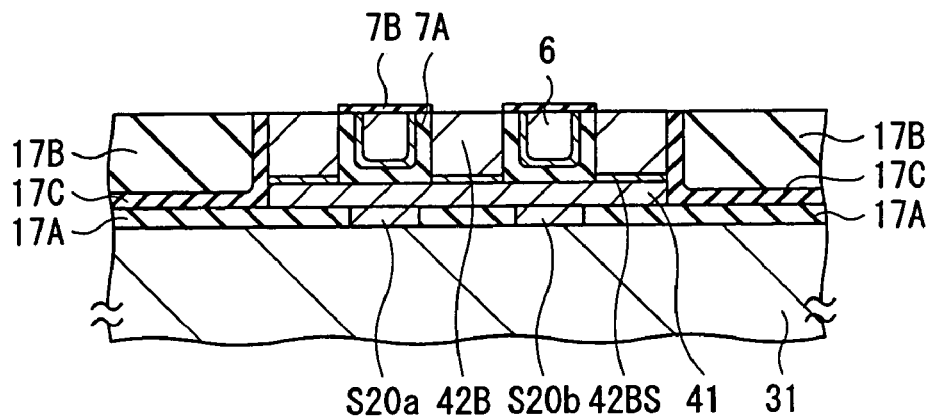
FIG. 23 is an enlarged cross section showing a process subsequent to FIG. 22.
Figure 24:
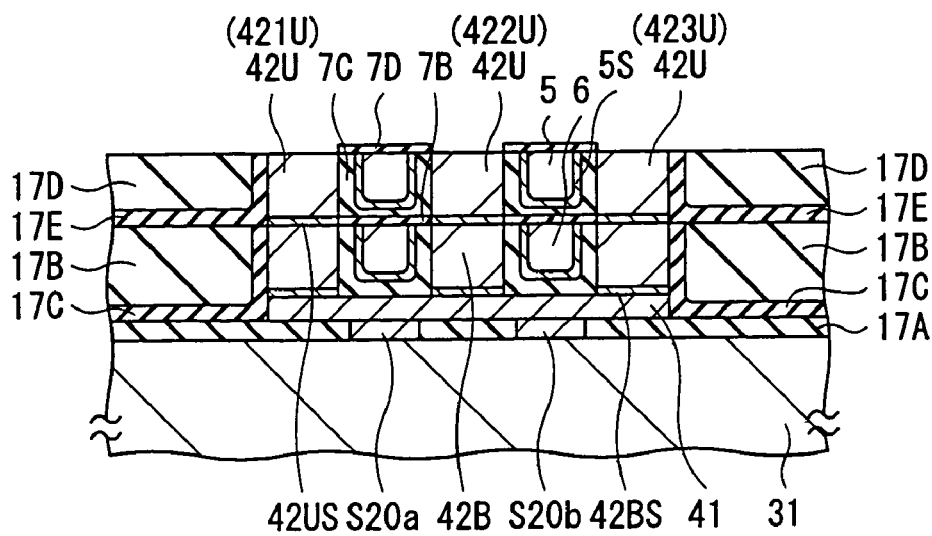
FIG. 24 is an enlarged cross section showing a process subsequent to FIG. 23.

In the following fourth process, an insulating film 7B is formed so as to cover the top face of the write word line 6 and surround the periphery of the write word line 6 in cooperation with the insulating film 7A. Concretely, as shown in FIG. 22, a resist pattern 30D is selectively formed in regions except for the region in which the write word line 6, underplating film 6S, and insulating film 7A are exposed in the surface. After that, the resist pattern 30D is used as a mask and sputtering is performed, thereby forming the insulating film 7B made of, for example, $Al_2O_3$ as shown in FIG. 23. Further, by removing the resist pattern 30D, the insulating film 7B covering the write word line 6, underplating film 6S, and the insulating film 7A appears. By forming an undercut in a lower part of the end face of the resist pattern 30D, the resist pattern 30D can be easily peeled off.

In a fifth process, three top pillar yokes 42U (421U, 422U, and 423U) are formed on the three bottom pillar yokes 42B (421B, 422B, and 423B), respectively. The top pillar yokes 42U can be formed by repeating an operation similar to the process of forming the bottom pillar yokes 42B shown in FIGS. 14 and 15. In a sixth process, the write bit lines 5 (5a and 5b) are formed via the insulating film 7C between the top pillar yokes 42U. The write bit lines 5 can be formed by repeating an operation similar to that of forming the write word lines 6 shown in FIGS. 16 to 23. Further, in a seventh process, an insulating film 7D is formed so as to cover the top face of the write bit line 5 and surround the write bit line 5 in cooperation with the insulating film 7C. Hereinbelow, by referring to FIG. 24, the fifth to seventh processes will be described concretely.

In the fifth process, first, the insulating film 7B is formed in the fourth process and, after that, an underplating film 42US made of $Ni_{0.5}Fe_{0.5}$ is formed on the entire face by, for example, sputtering. A resist pattern (not shown) is selectively formed on the underplating film 42US. In this case, the region for forming the top pillar yoke 42U is left. The resultant is soaked in a plating bath, and a plating process using the underplating film 42US as an electrode is performed, thereby forming the top pillar yoke 42U made of, for example, $Ni_{0.5}Fe_{0.5}$. After forming the top pillar yoke 42U, the resist pattern is peeled off, and the exposed underplating film 42US is removed by milling or the like. In the following sixth process, an insulating film 7C made of $Al_2O_3$ or the like is formed so as to cover the whole by using, for example, a CVD apparatus. After that, the underplating film 5S made of, for example, copper is formed so as to cover the insulating film 7C by sputtering or the like. A resist pattern (not shown) is selectively formed so as to leave the regions between the top pillar yokes 42U. Further, the write bit lines 5 are formed so as to bury at least the region between the top pillar yokes 42U. In this case, the resultant is soaked in a plating bath and a plating process using the underplating film 5S as an electrode is performed, thereby forming the write bit line 5 made of copper. After formation of the write bit line 5, the resist pattern is peeled off and the underplating film 5S is removed by milling or the like. Further, an insulating film 17D made of, for example, $Al_2O_3$ is formed so as to cover the whole by sputtering or the like. After that, the whole face is polished to a predetermined thickness so as to be planarized by using, for example, a CMP (Chemical Mechanical Polishing) apparatus. In the following seventh process, a resist pattern (not shown) is selectively formed in regions except for the region in which the write bit line 5, underplating film 5S, and insulating film 7C are exposed in the surface. The resist pattern is used as a mask and sputtering is performed, thereby forming the insulating film 7D made of, for example, $Al_2O_3$. By removing the resist pattern, the insulating film 7D covering the write bit line 5, underplating film 5S, and the insulating film 7C appears.

Figure 25:
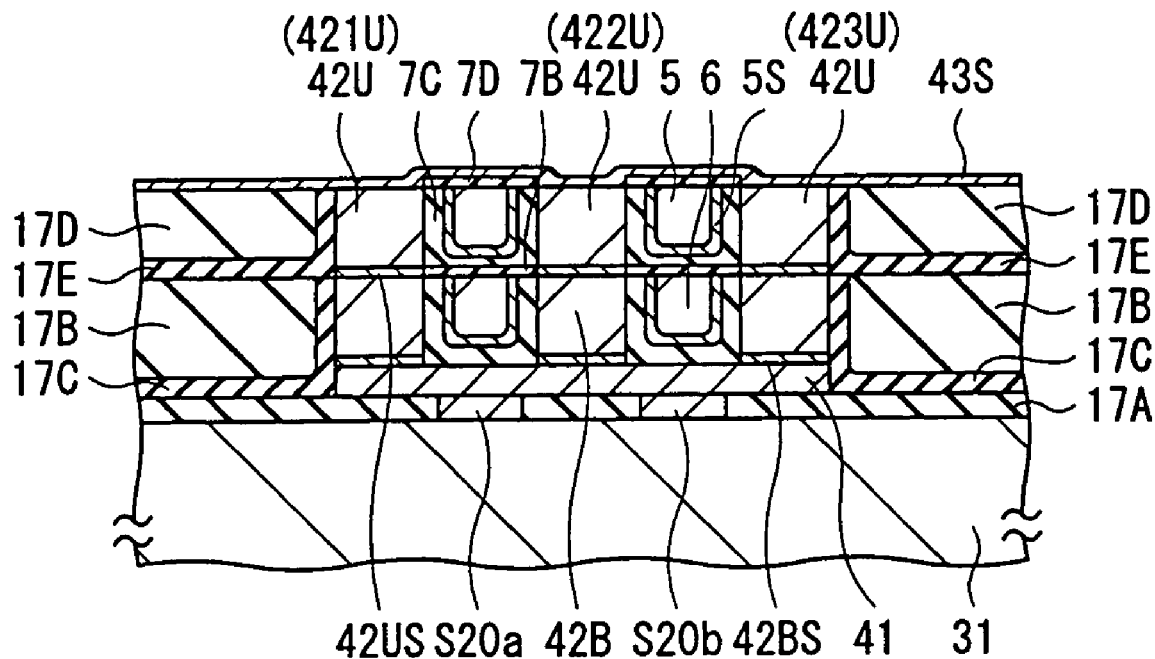
FIG. 25 is an enlarged cross section showing a process subsequent to FIG. 24.
Figure 26:
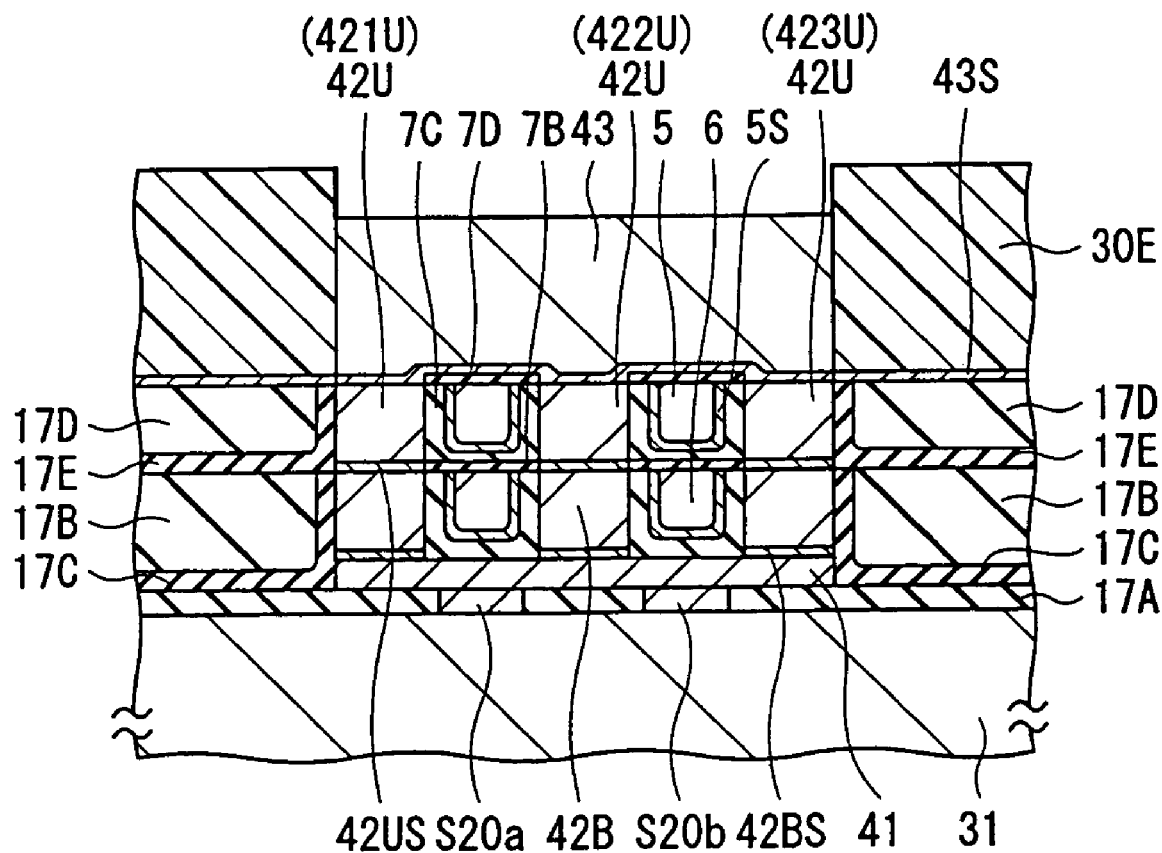
FIG. 26 is an enlarged cross section showing a process subsequent to FIG. 25.
Figure 27:
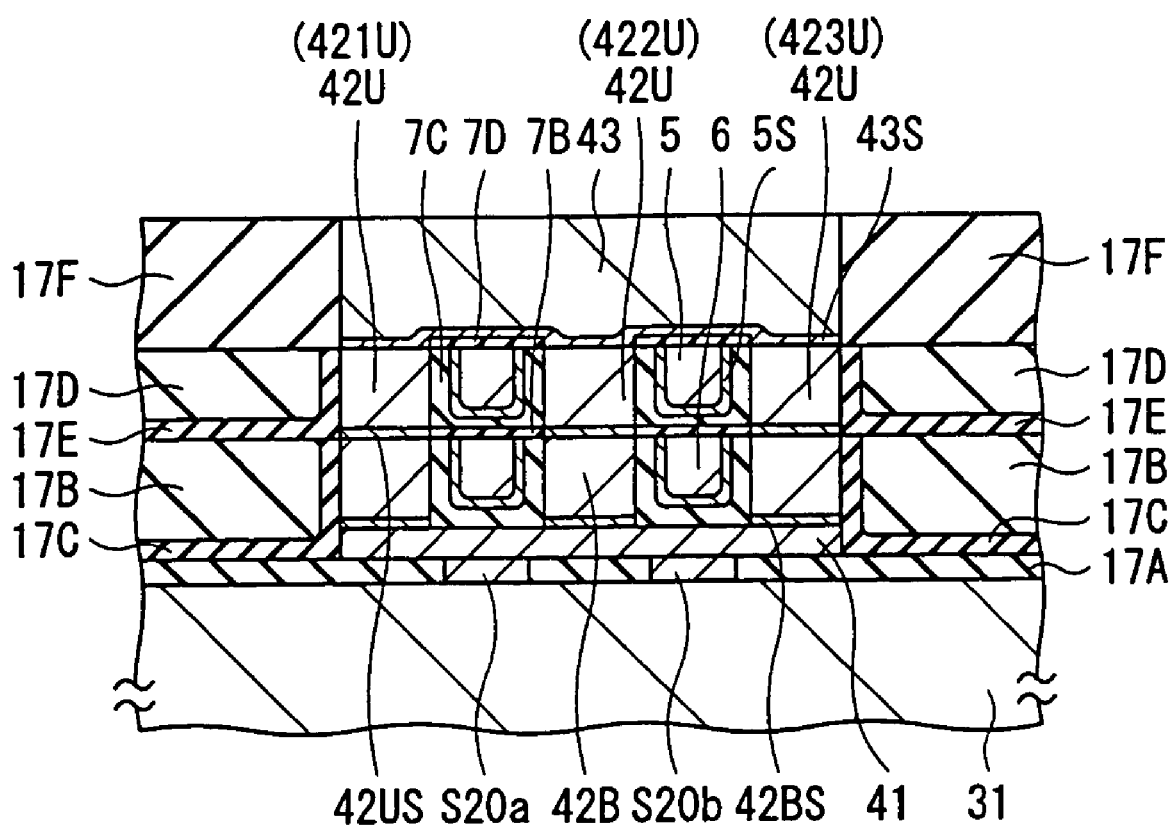
FIG. 27 is an enlarged cross section showing a process subsequent to FIG. 26.

In the following eighth process, by providing the second beam yoke 43 so as to cover the top pillar yoke 42U and the insulating film 7D, formation of the magnetic yoke 4 constructed by the first beam yoke 41, the pillar yokes 421 to 423 (bottom and top pillar yokes 42B and 42U), and the second beam yoke 43 is completed. Concretely, first, as shown in FIG. 25, the underplating film 43S is formed so as to cover the whole by sputtering or the like. Next, as shown in FIG. 26, a resist pattern 30E is selectively formed on the underplating film 43S except for the region corresponding to the formation region of the first beam yoke 41. The resist pattern 30E is used as a mask and a plating process using the underplating film 43S is performed, thereby forming the second beam yoke 43 made of, for example, $Ni_{0.7}Fe_{0.3}$. After formation of the second beam yoke 43, the resist pattern 30E is peeled off and the exposed underplating film 43S is removed by milling or the like. Subsequently, an insulating film 17F made of $Al_2O_3$ or the like is formed on the whole face. As shown in FIG. 27, the whole face is polished to a predetermined thickness by using, for example, a CMP apparatus and planarized. The formation of the magnetic yoke 4 is completed and the memory cell 1 is completed. Further, the read word line 32 having a desired width is formed so as to be electrically connected to the second beam yoke 43.

After that, the write word line lead electrodes 46 are formed at both ends of the write word line 6, the write bit line lead electrodes 47 are formed at both ends of the write bit line 5, the read word line lead electrodes 48 are formed at both ends of the read word line 32 and, further, the read bit line lead electrodes 49 are formed at both ends of the read bit line 33.

In such a manner, formation of the memory cell group 54 including the memory cells 1 is completed.

Further, by performing a process of forming a protection layer made of silicon oxide ($SiO_2$), $Al_2O_3$, or the like by a sputtering apparatus, a CVD apparatus, or the like and a process of polishing the protection layer to expose the lead electrodes 46 to 49, manufacture of the magnetic memory device is completed.

As described above, in the embodiment, the bottom and top pillar yokes 42 and the second beam yokes 43 in the magnetic yoke 4, write bit line 5, and write word line 6 are formed by plating. They can be also formed by a combination of a dry film forming method by sputtering and a dry patterning method such as milling, reactive ion etching, or the like. As compared with the case where they are formed by a dry method such as sputtering, the case of forming them by plating is more preferable since the edge angle can be increased more easily and the yoke 4, write bit line 5 and write word line 6 can be formed with high precision and with sufficient thickness.

Second Embodiment

A magnetic memory device of a second embodiment of the invention will now be described with reference to FIGS. 28A and 28B and FIGS. 29A and 29B.

Figure 28A:
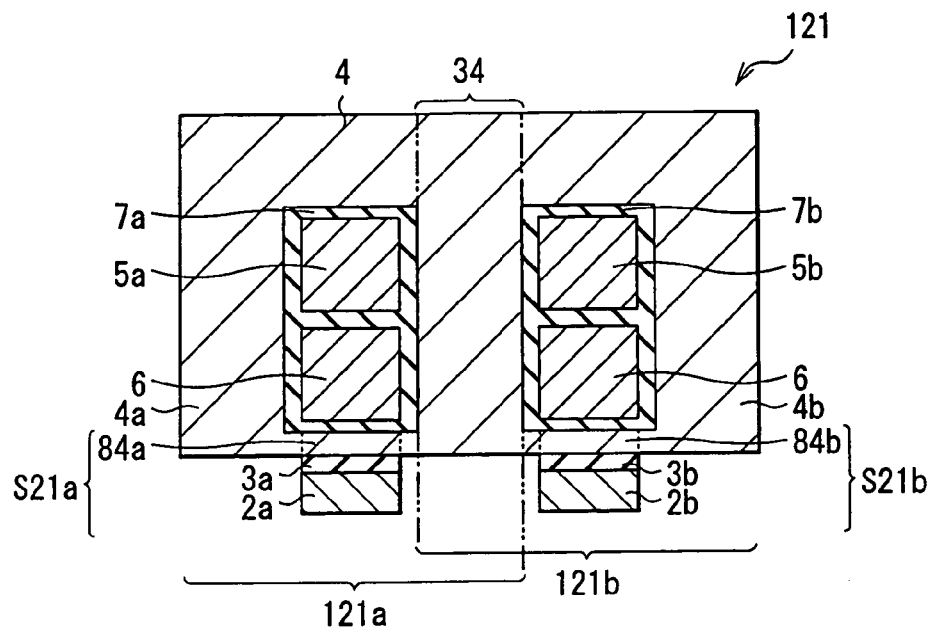
FIGS. 28A and 28B are cross sections showing the configuration of a main part of a magnetic memory device according to a second embodiment of the invention.
Figure 28B:
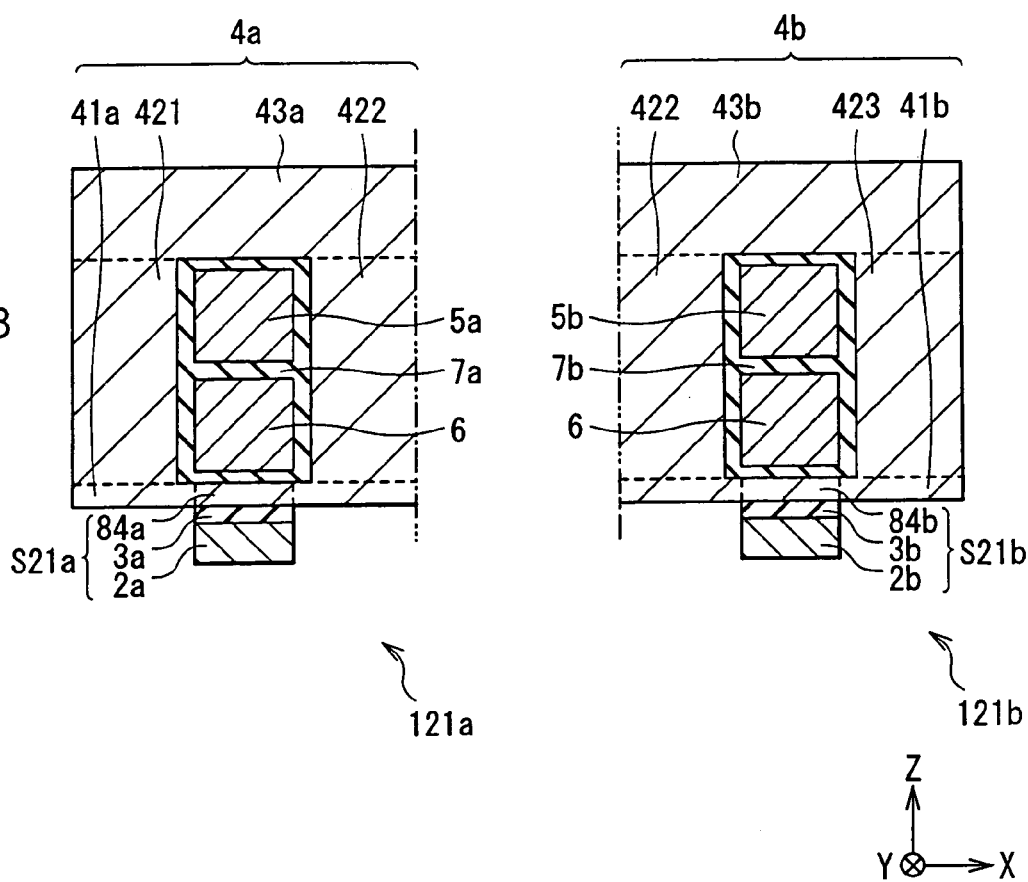

FIGS. 28A and 28B show a sectional configuration of a memory cell 121 in a magnetic memory device of the second embodiment, which corresponds to the memory cell 1 in FIGS. 5A and 5B of the first embodiment. In FIGS. 28A and 28B, the same reference numerals are assigned to components substantially the same as those shown in FIGS. 5A and 5B.

In the following, with respect to the configuration of the magnetic memory device of the second embodiment and a method of manufacturing the magnetic memory device, the points different from the first embodiment will be mainly described and the other description be omitted appropriately.

In the memory cell 1 of the first embodiment, each of the pair of the TMR elements 1a and 1b has: the magnetic yokes 4a and 4b constructed so as to surround the whole periphery of the write bit lines 5a and 5b and the write word line 6, respectively; and the stacked bodies S20a and S20b including the second magnetic layers 8a and 8b as a magneto-sensitive layer of which magnetization direction changes according to an external magnetic field, magnetically coupled to the magnetic yokes 4a and 4b, and constructed so that current flows in the direction perpendicular to the stacked face. A part of the magnetic yokes 4a and 4b are shared with each other. In contrast, in the memory cell 121 of the second embodiment, as shown in FIGS. 28A and 28B, connection parts 84a and 84b as a part of the magnetic yoke 4 also serve as magneto sensitive layers in the stacked bodies S21a and S21b.

In short, in the TMR 121a and TMR 121b, the connection parts 84a and 84b as a part of the magnetic yokes 4a and 4b also function as the magneto-sensitive layer in the stacked bodies S21a and S21b. Therefore, the second magnetic layers 8a and 8b provided for the TMR elements 1a and 1b can be omitted. The memory cell 121 can have a configuration simpler than that of the memory cell 1.

In this case, it is preferable that the axes of easy magnetization of the first magnetic layers 2a and 2b and the connection parts 84a and 84bbe parallel with each other so that the magnetization direction of the first magnetic layers 2a and 2b and that of the coupled parts 84a and 84b are stabilized to be the same or different from each other. The thickness in the section direction in the connection parts 84a and 84b of the magnetic yokes 4a and 4b is, for example, 20 nm. The magnetic yokes 4a and 4b have the coercive force which increases toward the connection parts 84a and 84b and have the maximum coercive force in the connection parts 84a and 84b. Specifically, the first beam yokes 41a and 41b have the coercive force larger than that of the pillar yokes 421 to 423 and the second beam yokes 43a and 43b. In the first beam yokes 41a and 41b, particularly, the connection parts 84a and 84b have the maximum coercive force. In this case, the coercive force in the pillar yokes 421 to 423 and that of the second beam yokes 43a and 43b may be equal to each other. However, in consideration of the influence on the connection parts 84a and 84b by remanent magnetization, it is preferable that the pillar yokes 421 to 423 have the coercive force larger than that of the second beam yokes 43a and 43b. Preferably, the coercive force of the connection parts 84a and 84b is preferably in the range of $(50/4\pi)\times10^3$ A/m or larger and $(100/4\pi)\times 10^3$ A/m or smaller and is smaller than that of the first magnetic layers 2a and 2b. With the coercive force smaller than $(50/4\pi)\times10^3$A/m, the magnetization direction of the connection parts 84a and 84b may be disturbed by undesirable magnetic fields such as external scattered magnetic fields or the like. On the other hand, with the coercive force exceeding $(100/4\pi)\times10^3$ A/m, there is the possibility that the TMR elements 121a and 121b themselves deteriorate due to heat generation caused by increase in the write current. Further, when the coercive force of the connection parts 84a and 84b becomes equal to or larger than that of the first magnetic layers 2a and 2b, write current increases and the magnetization direction of the first magnetic layers 2a and 2b as a magnetization fixed layer changes and the TMR elements 121a and 121b as memory elements are destroyed.

Figure 29A:
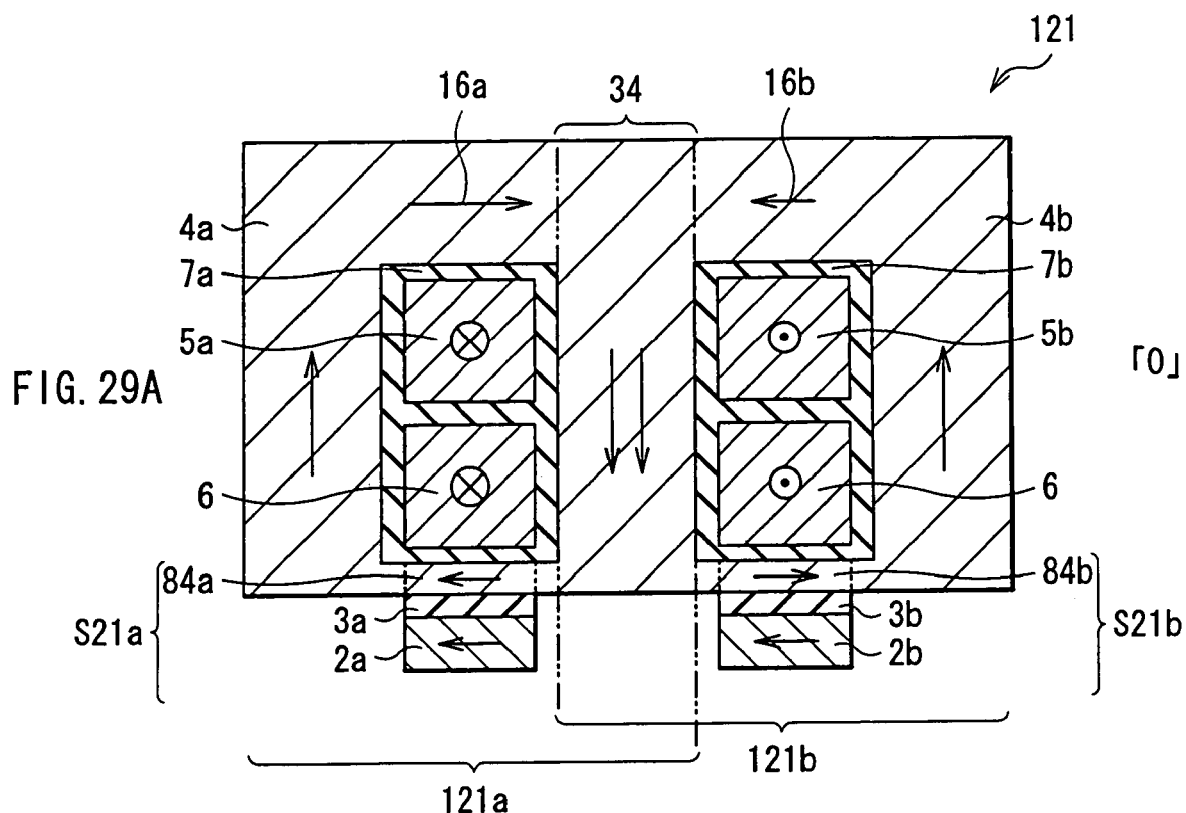
FIGS. 29A and 29B are diagrams showing the relation between a write current direction and a return magnetic field direction (magnetization direction) in the sectional configuration of the memory cell illustrated in FIGS. 28A and 28B.
Figure 29B:
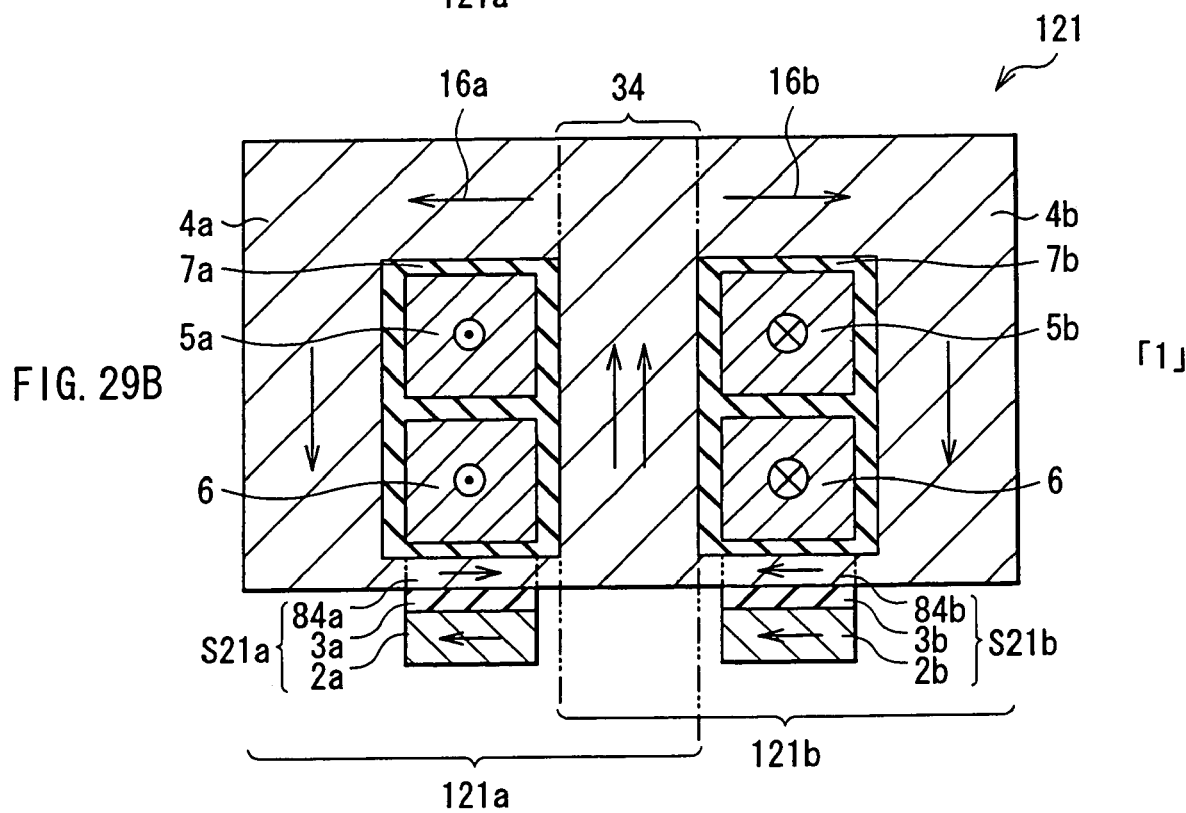

In the memory cell 121, the connection parts 84a and 84b function as memory layers for storing information. Specifically, the magnetization direction of the connection parts 84a and 84b is inverted by a return magnetic field generated by the write current flowing in the write bit line 5 and the write word line 6 and information is stored. In the following, with reference to FIGS. 29A and 29B, the writing operation in the memory cell 121 will be concretely described. FIGS. 29A and 29B show the relation between the write current direction and the return magnetic field direction (magnetization direction) in a sectional configuration of the memory cell 121 illustrated in FIGS. 28A and 28B.

FIGS. 29A and 29B show the case where the write current flows in the same direction in the write bit lines 5a and 5b and the write word line 6 which are parallel with each other and pass the TMR elements 121a and 121b. FIG. 29A shows a case where write current flows from this side to the depth in the direction perpendicular to the drawing sheet (to the +Y direction) in the TMR element 121a, the return magnetic field 16a is generated in the clockwise direction in the magnetic yoke 4 surrounding the write bit line 5a, write current flows from the depth to this side (to the −Y direction) in the direction perpendicular to the drawing sheet in the TMR element 121b, and the return magnetic field 16b is generated in the counterclockwise direction in the magnetic yoke 4 in the portion surrounding the write bit line 5b. In this case, the magnetization direction of the connection part 84a is the −X direction and the magnetization direction of the connection part 84b is the +X direction. FIG. 29B corresponds to the case where the directions of current flowing in the write bit line 5 and the write word line 6 are opposite to those shown in FIG. 29A. Specifically, FIG. 29B shows a case where write current flows from the depth to this side in the direction perpendicular to the drawing sheet (to the −Y direction) in the TMR element 121a, the return magnetic field 16a is generated in the counterclockwise direction in the magnetic yoke 4a of the portion surrounding the write bit line 5a, write current flows from this side to the depth in the direction perpendicular to the drawing sheet (to the +Y direction) in the TMR element 121b, and the return magnetic field 16b is generated in the clockwise direction in the annular magnetic yoke 4 of the portion surrounding the write bit line 5b. In this case, the magnetization direction of the connection part 84a is the +X direction and the magnetization direction of the connection part 84b is the −X direction.

When current flows in the same direction in the write bit line 5 and the write word line 6, the magnetization directions of the connection parts 84a and 84b are inverted and 0 or 1 is recorded. For example, in the case where the "0" corresponds to the state of FIG. 29A, the state of FIG. 29B is identified as "1". In the case where the write currents flow in the opposite directions or the write current flows only one of the lines, the magnetization directions of the connection parts 84a and 84b are not inverted and data is not rewritten.

As described above, in the magnetic memory device of the embodiment, the connection parts 84a and 84b as parts of the magnetic yoke 4 also function as the magneto-sensitive layer in the stacked bodies S21a and S21b, so that the memory cell 121 having a simpler configuration can be obtained. In addition, in the magnetic memory device of the embodiment, the magnetic yokes 4a and 4b have the coercive force which increases toward the connection parts 84a and 84b and have the maximum coercive force in the connection parts 84a and 84b. Thus, the magnetization directions of the connection parts 84a and 84b can be stably held. As a result, a read error caused by unintended magnetization inversion in the second magnetic layers 84a and 84b can be prevented.

Although the invention has been described above by some embodiments, the invention is not limited to the embodiments but can be variously modified. For example, in the foregoing embodiments, the magnetic yoke is divided into some parts and the coercive force is set to increase step by step toward the magneto-sensitive layer. However, the invention is not limited to the configuration. For example, the coercive force may be continuously increased toward the magneto-sensitive layer by continuously changing the composition ratio of magnetic materials of the magnetic yoke.

Figure 30:
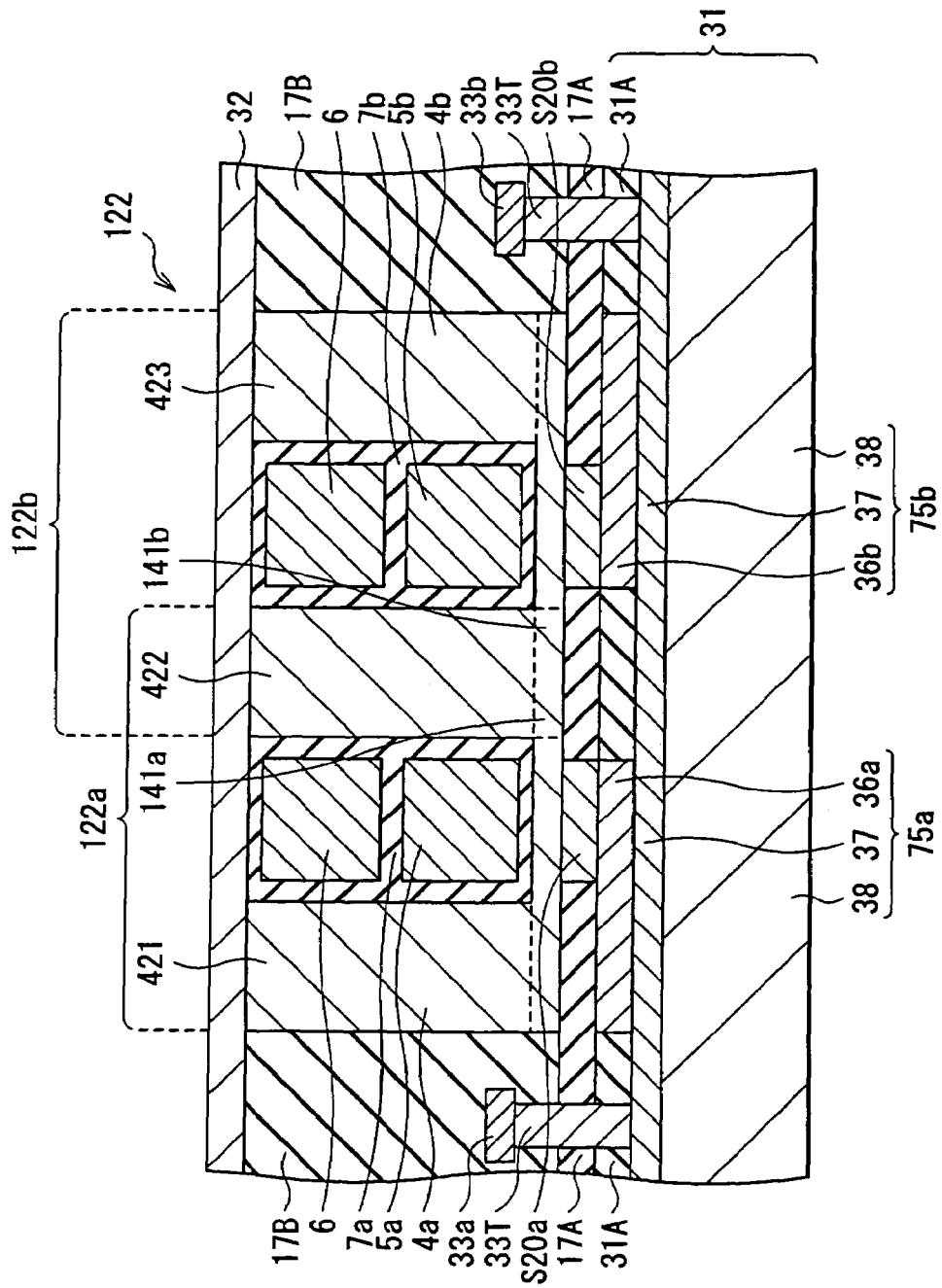
FIG. 30 is a cross section showing a first modification of the memory cell illustrated in FIG. 7.

In the first and second embodiments, the case where a part of the magnetic yoke formed so as to surround the whole periphery of the first and second write lines is shared by the pair of magneto-resistive elements in the magnetic memory cell has been described, but the invention is not limited to the case. To be concrete, like a memory cell 122 (first modification) shown in FIG. 30, two U-shaped magnetic yokes (magnetic yokes each having a sectional shape a part of which is open) constructed to surround a part of the periphery of the first and second write lines and each having an opening on the side opposite to the stacked body may be connected to each other. The memory cell 122 has: a TMR element 122a including the magnetic yoke 4a constructed by a pair of pillar yokes 421 and 422 facing each other and extending in the direction orthogonal to the layer stacked face of the stacked body S20a and a beam yoke 141a connected to one end on the side of the stacked body S20a of each of the pair of pillar yokes 421 and 422; and a TMR element 122b including the magnetic yoke 4b constructed by a pair of pillar yokes 422 and 423 facing each other and extending in the direction orthogonal to the layer stacked face of the stacked body S20b and a beam yoke 141b connected to one end on the side of the stacked body S20b of each of the pair of pillar yokes 422 and 423. The pair of TMR elements 122a and 122b share the pillar yoke 422. Also in the memory cell 122 having such a configuration, the magneto-sensitive layer has a coercive force larger than that of the magnetic yoke or the magneto-sensitive layer as a part of the magnetic yoke has a coercive force larger than that of the other part in the magnetic yoke, thereby enabling stability in the magnetization direction of the magneto-sensitive layer to be assured. In this case, all of the magnetic yokes may have equal coercive force. Particularly, when the beam yokes 141a and 141b have the coercive force larger than that of the pillar yokes 421 to 423, the magnetization direction of the magneto-sensitive layer can be held more stably, and stability in the reading operation is further improved.

Figure 31:
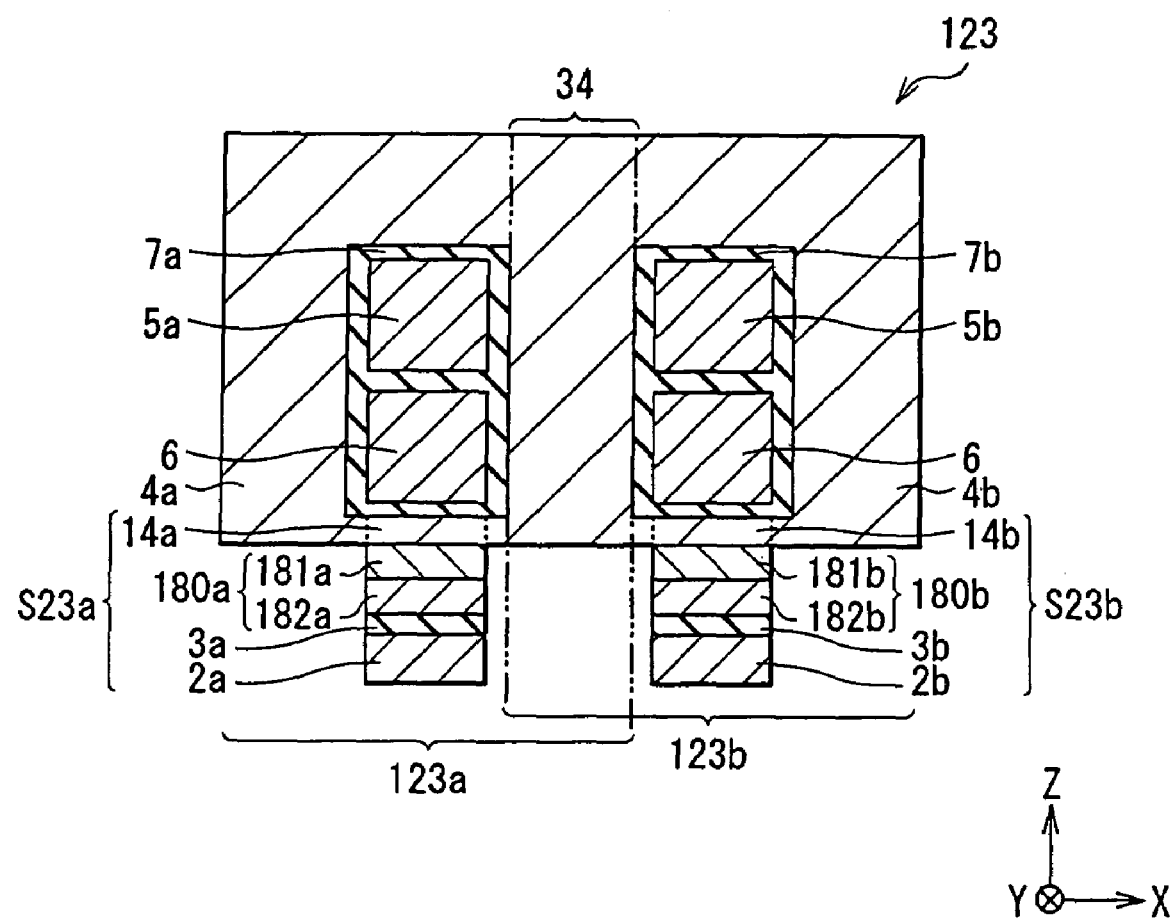
FIG. 31 is a cross section showing a second modification of the memory cell illustrated in FIG. 7.

The configuration of the stacked body is not limited to that of the stacked bodies S20a and S20b shown in FIGS. 5A and 5B or the stacked bodies S21a and S21b shown in FIGS. 28A and 28B in the foregoing embodiments. For example, like stacked bodies S23a and S23b of a memory cell 123 (second modification) shown in FIG. 31, second magnetic layers 180a and 180b as magneto-sensitive layers may have a two-layered structure including first free magnetization layers 181a and 181b and second free magnetization layers 182a and 182b having a coercive force larger than that of the first free magnetization layers 181a and 181b, respectively. Although not shown, it is also possible to provide an antiferromagnetic layer on the side opposite to the tunnel barrier layers 3a and 3b of the first magnetic layers 2a and 2b in the stacked bodies S20a and S20b or the stacked bodies S21a and S21b to thereby stabilize magnetization of the first magnetic layers 2a and 2b. The stacked body is not limited to the configuration that current flows in the direction orthogonal to the layer stacked face but may be constructed so that current flows along the layer stacked face.

Figure 32:
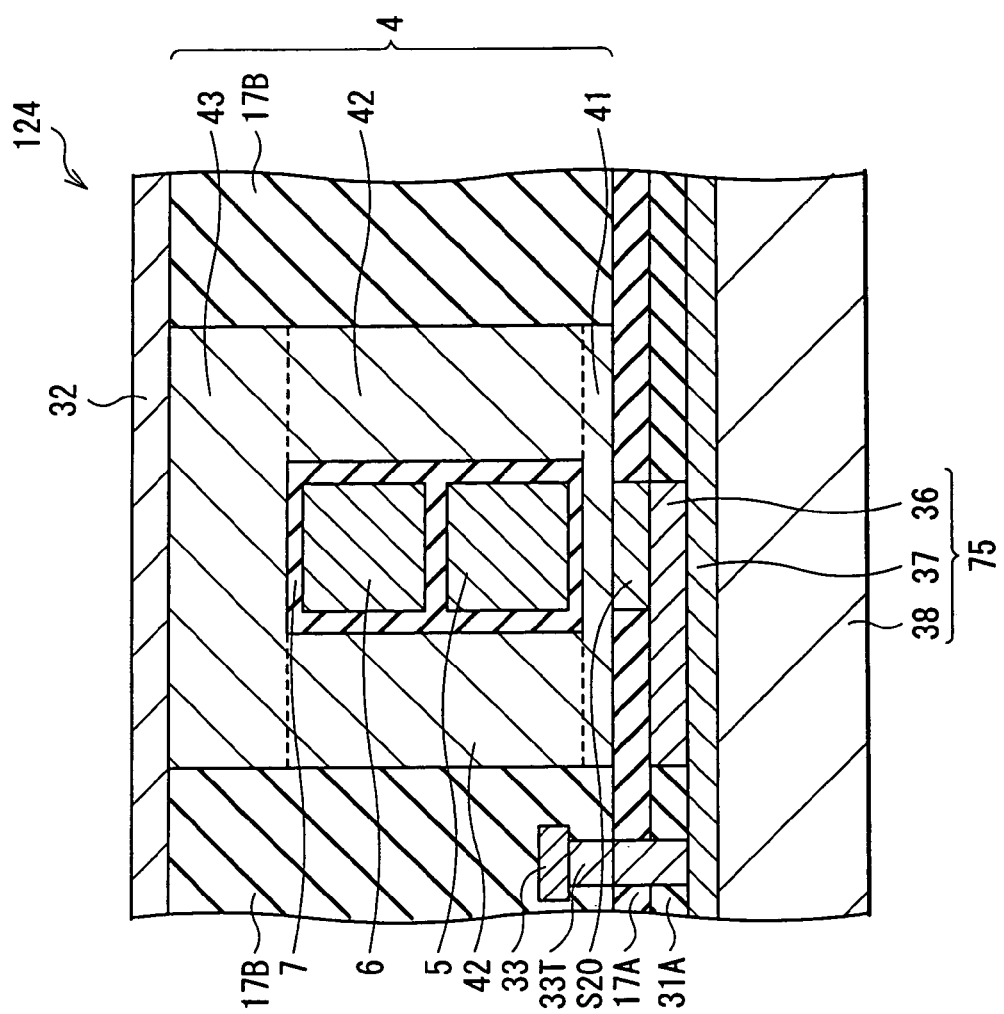
FIG. 32 is a cross section showing a third modification of the memory cell illustrated in FIG. 7.
Figure 33:
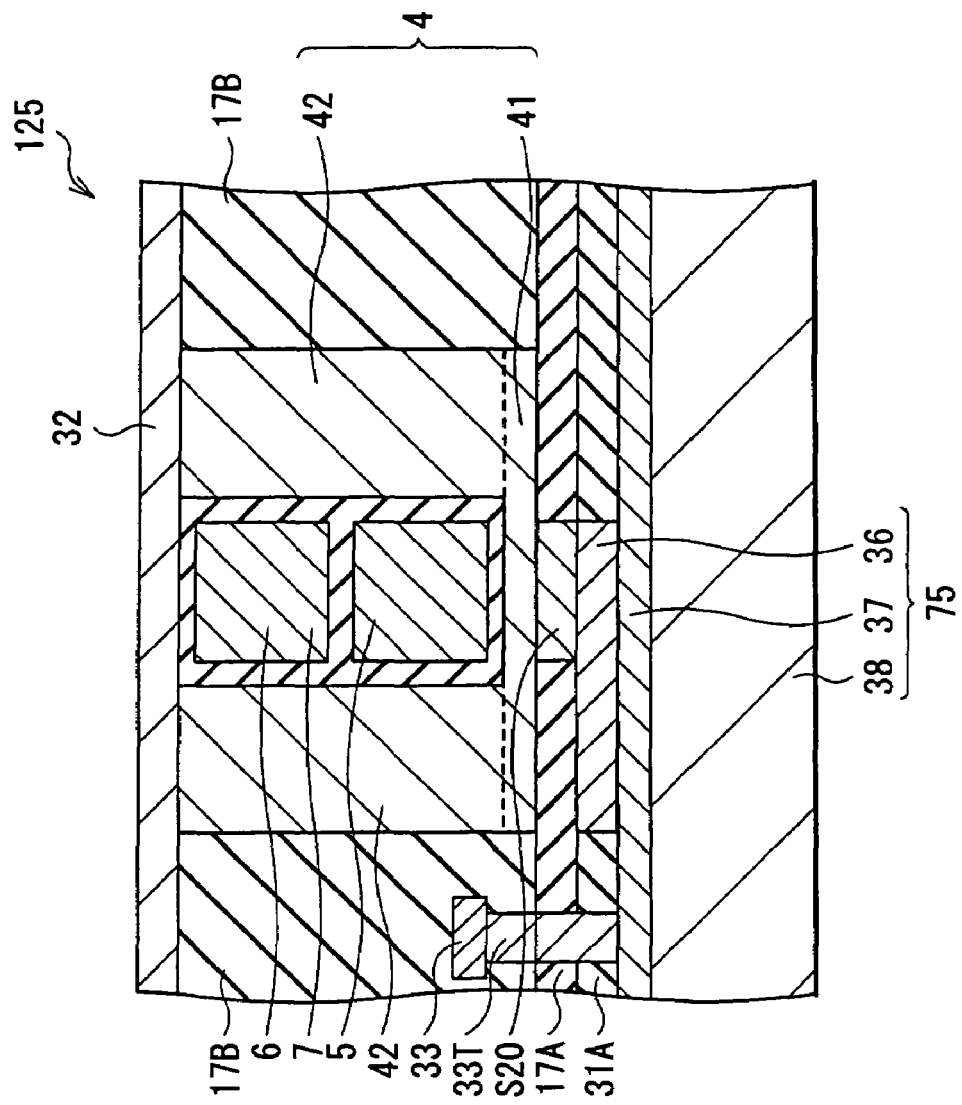
FIG. 33 is a cross section showing a fourth modification of the memory cell illustrated in FIG. 7.
Figure 34:
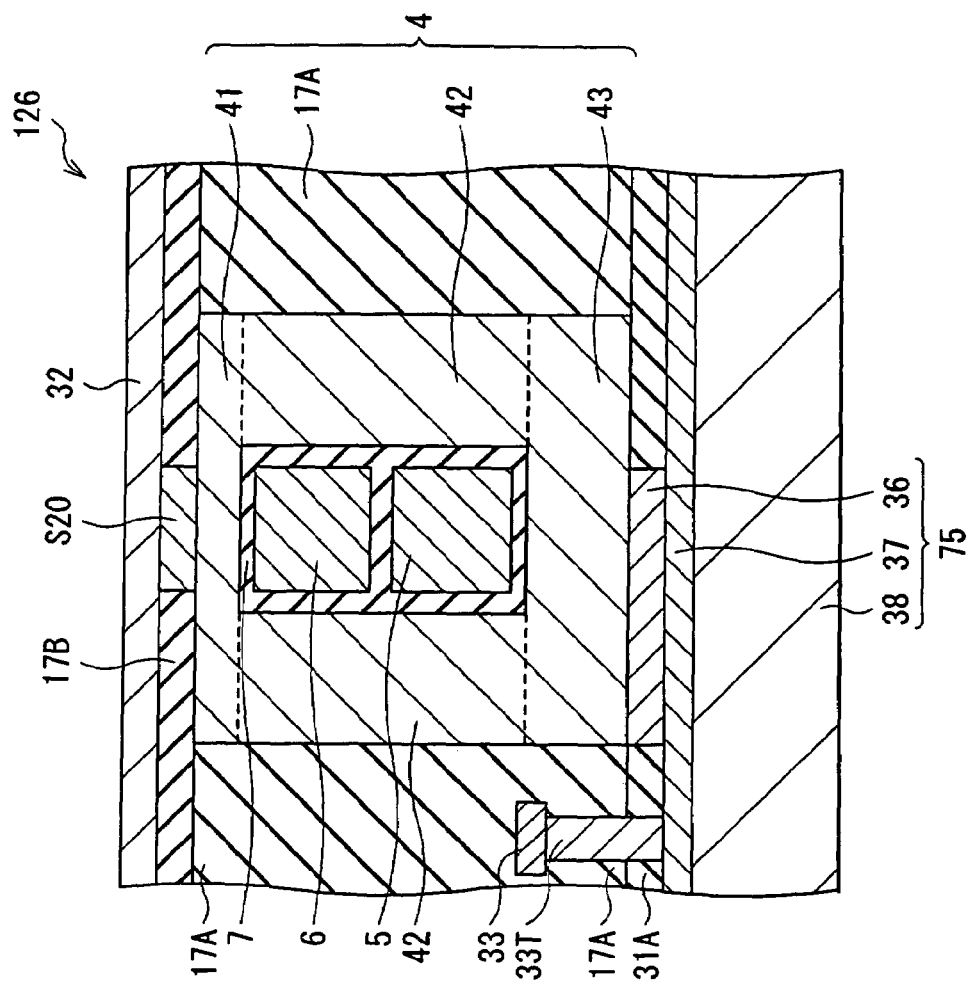
FIG. 34 is a cross section showing a fifth modification of the memory cell illustrated in FIG. 7.
Figure 35:
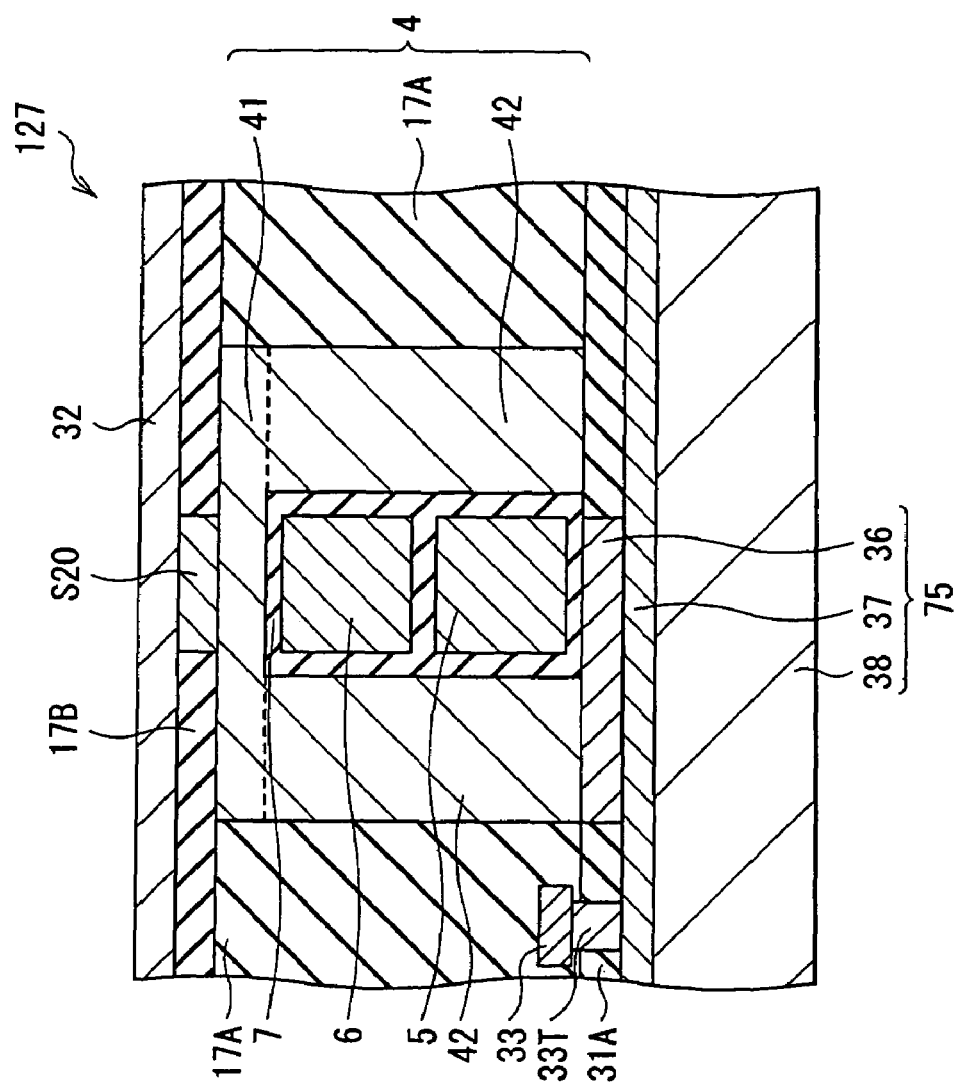
FIG. 35 is a cross section showing a sixth modification of the memory cell illustrated in FIG. 7.

Although the magnetic memory cell having a pair of magneto-resistive elements has been described in the foregoing embodiments, the invention is not limited to the magnetic memory cell. For example, like a memory cell 124 (third modification) shown in FIG. 32, a single TMR element having one magnetic yoke 4 and one stacked body S20 may be used as a magnetic memory element. Also in the memory cell constructed by the single TMR element, like a memory cell 125 (fourth modification) shown in FIG. 33, not the magnetic yoke constructed so as to surround the whole periphery of the first and second write lines but a magnetic yoke having a U shape in cross section, a part of which is open may be provided. In particular, in the case of a memory cell made by a single TMR element, like a memory cell 126 (fifth modification) shown in FIG. 34, the stacked body S20 can be provided on the side opposite to the substrate 31 over the magnetic yoke 4. In this case as well, like a memory cell 127 (sixth modification) shown in FIG. 35, the magnetic yoke 4 having a sectional shape a part of which is open can be obtained. Also in the memory cells 124 to 127 having such configurations, the magneto-sensitive layer has a coercive force larger than that of the magnetic yoke or the magneto-sensitive layer as a part of the magnetic yoke has a coercive force larger than that of the other portion in the magnetic yoke, thereby enabling stability in the magnetization direction of the magneto-sensitive layer to be assured. Further, also in the memory cells 124 to 127, the coercive force in the magnetic yoke 4 increases in order of the second beam yoke 43, the pair of pillar yokes 42, and the first beam yoke 41, thereby enabling the magnetization direction of the magneto-sensitive layer to be held more stably.

Figure 36:
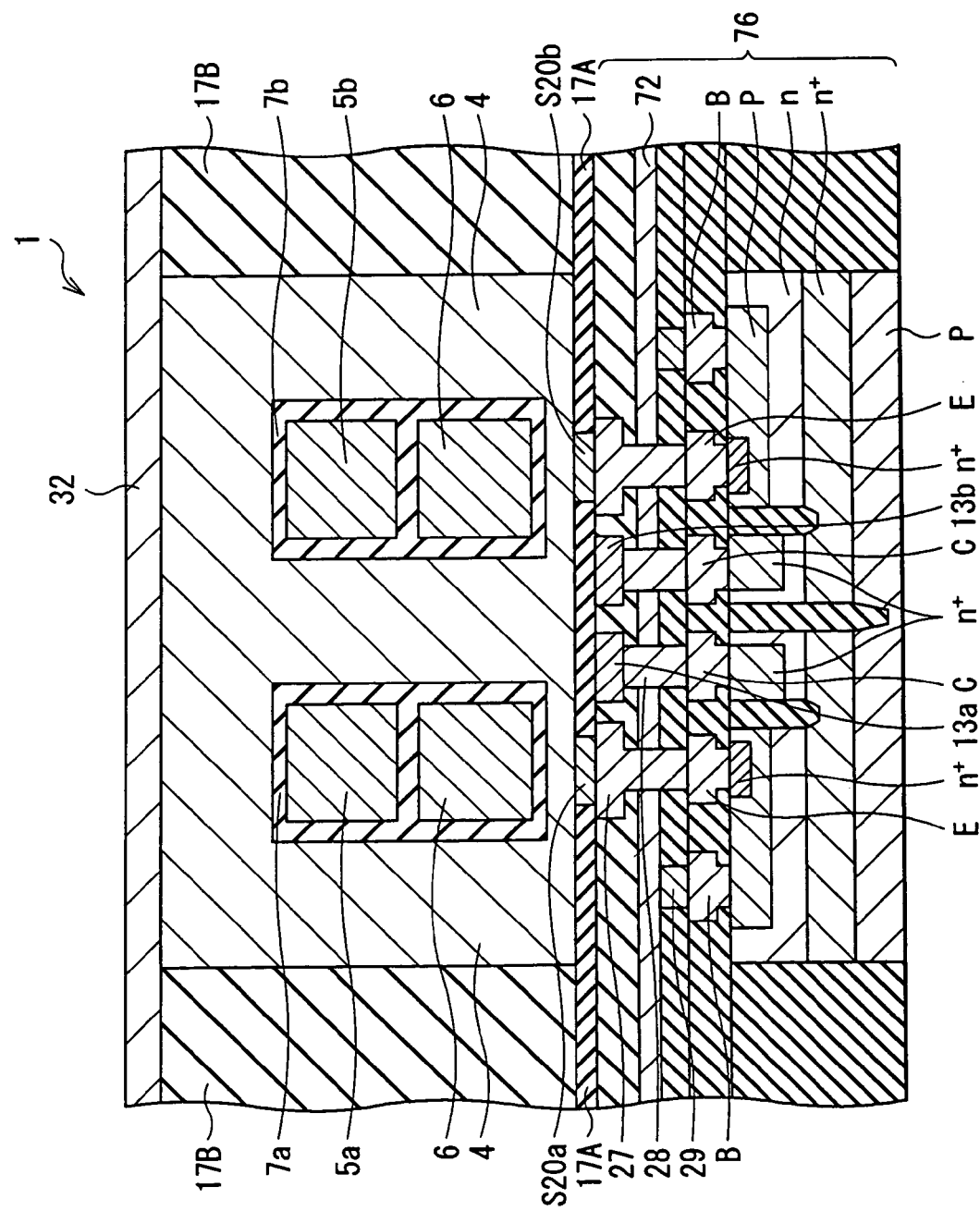
FIG. 36 is a cross section showing a sectional configuration of a modification of a rectifying device in the circuit configuration illustrated in FIG. 10.
Figure 37:
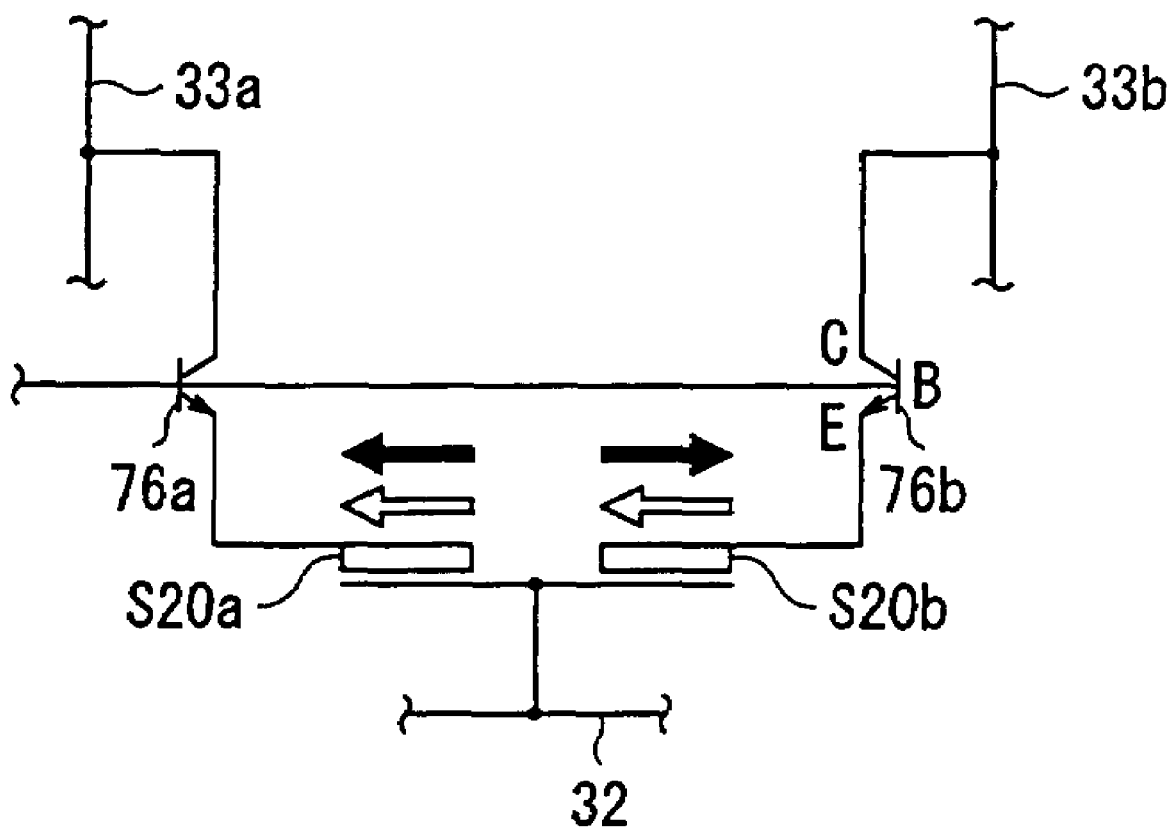
FIG. 37 is a circuit diagram showing a main part of a circuit configuration including a rectifying device as a modification of FIG. 36.

Further, although a pair of diodes is used as a rectifier in the read circuit in the embodiment, the invention is not limited to the configuration. For example, as shown in FIGS. 36 and 37, a pair of bipolar transistors 76a and 76b may be used. FIG. 36 shows a sectional configuration of the bipolar transistors 76a and 76b. FIG. 37 shows the configuration of a main part of a circuit in the case where the bipolar transistors 76a and 76b are provided between the read bit lines 33a and 33b and the stacked bodies S20a and S20b. As shown in FIGS. 36 and 37, each one end of the TMR elements 1a and 1b in each memory cell 1 is connected to the read bit lines 33a and 33b via the pair of bipolar transistors 76a and 76b, respectively, and each of the other end is connected to the common read word line 32. More specifically, bases B in the pair of bipolar transistors 76a and 76b are connected to the word decode line 72, collectors C are connected to the read bit lines 33a and 33b via the connection layer 29, and emitters E are connected to the stacked parts 20a and 20b via the connection layer 27, respectively. In this case, when a control signal from the word decode line 72 reaches the bases B in the selected pair of bipolar transistors 76a and 76b, the collector C and the emitter E are made conductive, and read current flows in the stacked bodies S20a and S20b (stacked parts 20a and 20b), thereby reading information.

Obviously many modifications and variations of the present invention are possible in the light of the above teachings. It is therefore to be understood that within the scope of the appended claims, the invention may be practiced otherwise than as specifically described.

What is claimed is:

1. A magneto-resistive element comprising:
    a magnetic yoke disposed in correspondence with a partial region along an extension direction of a conductor and constructed so as to surround partially or entirely the periphery of the conductor; and
    a stacked body including a magneto-sensitive layer of which magnetization direction changes according to an external magnetic field, and magnetically coupled to the magnetic yoke,
    wherein the magneto-sensitive layer has coercive force larger than that of the magnetic yoke,
    and coercive force of the magnetic yoke increases toward the magneto-sensitive layer.

2. A magneto-resistive element according to claim 1, wherein the magnetic yoke includes:
    a pair of pillar yokes extending in a direction orthogonal to a layer stacked face of the stacked body while facing each other over the conductor;
    a first beam yoke to which one end on the stacked body side, of each of the pair of pillar yokes is connected; and
    a second beam yoke to which the other end of each of the pair of pillar yokes is connected,
    the pair of pillar yokes have coercive force larger than that of the second beam yoke, and
    the first beam yoke has coercive force larger than that of the pair of pillar yokes.

3. A magneto-resistive element according to claim 1, wherein the stacked body is constructed so that current flows in the direction orthogonal to a layer stacked face.

4. A magneto-resistive element comprising:
    a magnetic yoke disposed in correspondence with a partial region along an extension direction of a conductor and constructed so as to surround a part of the periphery of the conductor; and
    a stacked body including a magneto-sensitive layer of which magnetization direction changes according to an external magnetic field, and magnetically coupled to the magnetic yoke,
    wherein the magneto-sensitive layer has coercive force larger than that of the magnetic yoke.

5. A magnetic memory cell comprising a pair of magneto-resistive elements each having:
    a magnetic yoke disposed in correspondence with a partial region along an extension direction of a conductor and constructed so as to surround partially or entirely the periphery of the conductor; and
    a stacked body including a magneto-sensitive layer of which magnetization direction changes according to an external magnetic field, and magnetically coupled to the magnetic yoke,
    wherein the pair of magneto-resistive elements shares a part of the magnetic yoke,
    the magneto-sensitive layer has coercive force larger than that of the magnetic yoke, and
    the coercive force of the magnetic yoke increases toward the magneto-sensitive layer.

6. A magnetic memory cell according to claim 5, wherein each of the pair of magnetic yokes includes:
    a pair of pillar yokes extending in a direction orthogonal to a layer stacked face of the stacked body while facing each other over the conductor; and
    a beam yoke to which one end on the stacked body side, of each of the pair of pillar yokes is connected,
    the beam yoke has coercive force larger than that of the pair of pillar yokes, and
    the pair of magneto-resistive elements shares at least one of the pair of pillar yokes.

7. A magnetic memory cell according to claim 5, wherein each of the pair of magnetic yokes includes:
    a pair of pillar yokes extending in a direction orthogonal to a layer stacked face of the stacked body while facing each other over the conductor;
    a first beam yoke to which one end on a stacked body side, of each of the pair of pillar yokes is connected; and
    a second beam yoke to which the other end of each of the pair of pillar yokes is connected,
    the pair of pillar yokes have coercive force larger than that of the second beam yoke,
    the first beam yoke has coercive force larger than that of the pair of pillar yokes, and
    the pair of magneto-resistive elements shares at least one of the pair of pillar yokes.

8. A magnetic memory cell according to claim 5, wherein the stacked body is constructed so that current flows in the direction orthogonal to a layer stacked face.

9. A magnetic memory cell comprising a pair of magneto-resistive elements each having:
    a magnetic yoke disposed in correspondence with a partial region along an extension direction of a conductor and constructed so as to surround a part of the periphery of the conductor; and
    a stacked body including a magneto-sensitive layer of which magnetization direction changes according to an external magnetic field, and magnetically coupled to the magnetic yoke,
    wherein the pair of magneto-resistive elements shares a part of the magnetic yoke, and
    the magneto-sensitive layer has coercive force larger than that of the magnetic yoke.

10. A magnetic memory device comprising:
    a first write line;
    a second write line extending so as to cross the first write line; and
    a memory cell including a pair of magneto-resistive elements,
    each of the pair of magneto-resistive elements including:
    a magnetic yoke disposed in correspondence with a region in which the first and second write lines cross each other and constructed so as to surround partially or entirely the periphery of the first and second write lines; and
    a stacked body including a magneto-sensitive layer of which magnetization direction changes according to an external magnetic field and which is magnetically coupled to the magnetic yoke, and the pair of magneto-resistive elements sharing a part of the magnetic yoke, wherein the magneto-sensitive layer has coercive force larger than that of the magnetic yoke, and the magnetic yoke has coercive force which increases toward the magneto-sensitive layer.

11. A magnetic memory device according to claim 10, wherein each of the pair of magnetic yokes includes:

a pair of pillar yokes extending in a direction orthogonal to a layer stacked face of the stacked body while facing each other over the first and second write lines;

a first beam yoke to which one end on the stacked body side, of each of the pair of pillar yokes is connected; and a second beam yoke to which the other end of each of the pair of pillar yokes is connected, the pair of pillar yokes has coercive force larger than that of the second beam yoke, the first beam yoke has coercive force larger than that of the pair of pillar yokes, and the pair of magneto-resistive elements shares at least one of the pair of pillar yokes.

12. A magnetic memory device according to claim 10, wherein the stacked body is constructed so that current flows in a direction orthogonal to a layer stacked face.

13. A magnetic memory device comprising:

a first write line;

a second write line extending so as to cross the first write line; and a magnetic memory cell including a pair of magneto-resistive elements, each of the pair of magneto-resistive elements including:

a magnetic yoke disposed in correspondence with a region in which the first and second write lines cross each other and constructed so as to surround a part of the periphery of the first and second write lines; and a stacked body including a magneto-sensitive layer of which magnetization direction changes according to an external magnetic field and which is magnetically coupled to the magnetic yoke, and the pair of magneto-resistive elements sharing a part of the magnetic yoke, wherein the magneto-sensitive layer has coercive force larger than that of the magnetic yoke.

* * * * *